(12) United States Patent
Xu et al.

(10) Patent No.: US 11,545,088 B2
(45) Date of Patent: Jan. 3, 2023

(54) DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Chen Xu, Beijing (CN); Xueguang Hao, Beijing (CN); Jianbo Xian, Beijing (CN); Yong Qiao, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 478 days.

(21) Appl. No.: 16/480,493

(22) PCT Filed: Jan. 11, 2019

(86) PCT No.: PCT/CN2019/071409
§ 371 (c)(1),
(2) Date: Jul. 24, 2019

(87) PCT Pub. No.: WO2019/227943
PCT Pub. Date: Dec. 5, 2019

(65) Prior Publication Data
US 2021/0358407 A1 Nov. 18, 2021

(30) Foreign Application Priority Data
May 29, 2018 (CN) .......................... 201820812831.2

(51) Int. Cl.
*G09G 3/30* (2006.01)
*G09G 3/3233* (2016.01)
*H01L 27/32* (2006.01)

(52) U.S. Cl.
CPC ....... *G09G 3/3233* (2013.01); *H01L 27/3265* (2013.01); *H01L 27/3279* (2013.01);
(Continued)

(58) Field of Classification Search
CPC ................... G09G 3/32; G09G 3/3233; G09G 2300/0426; G09G 2300/0439;
(Continued)

(56) References Cited

U.S. PATENT DOCUMENTS 6,531,993 B1 * 3/2003 Yamazaki ............ G09G 3/3655
345/55
8,022,898 B2 9/2011 Kang et al.
(Continued)

FOREIGN PATENT DOCUMENTS

CN 103296033 A 9/2013
CN 103744242 A 4/2014
(Continued)

OTHER PUBLICATIONS

Extended European Search Report dated Mar. 14, 2022; Appln. No. 19739193.1.
(Continued)

*Primary Examiner* — Pegeman Karimi

(57) ABSTRACT

A display panel and a display device are provided. The display panel includes: a substrate, a plurality of pixel units, a functional signal line, and a first conductive structure. The substrate includes a display area and a peripheral area on at least one side of the display area, the plurality of pixel units are in the display area, each pixel unit includes a light-emitting unit and a pixel circuit structure for providing a driving current to the light-emitting unit, and the light-emitting unit is an electroluminescent element. The functional signal line is connected with the pixel circuit structure of each pixel unit and provides a common voltage signal for the pixel circuit structure. The first conductive structure is connected in parallel with the functional signal line and is located at a layer different from that of the functional signal line.

15 Claims, 12 Drawing Sheets

(52) U.S. Cl.
CPC ............... *G09G 2300/0426* (2013.01); *G09G 2300/0439* (2013.01); *G09G 2300/0852* (2013.01); *G09G 2310/061* (2013.01)

(58) Field of Classification Search
CPC ..... G09G 2300/0852; G09G 2310/061; G09G 3/30; G09G 3/34; G09G 3/36; H01L 27/3265; G01L 27/3279
See application file for complete search history.

(56) References Cited

U.S. PATENT DOCUMENTS

| | | | |
|---|---|---|---|
| 8,294,154 B2 | 10/2012 | Yamazaki et al. | |
| 9,588,387 B2* | 3/2017 | Lv | ........................ G09G 3/006 |
| 2010/0259527 A1* | 10/2010 | Odawara | .............. G09G 3/3233 345/211 |
| 2011/0084992 A1* | 4/2011 | Ishizuka | ................ G09G 3/325 345/690 |
| 2011/0157110 A1 | 6/2011 | Chou et al. | |
| 2012/0262184 A1* | 10/2012 | Shen | ....................... G09G 3/006 324/537 |
| 2013/0248869 A1 | 9/2013 | Chang. et al. | |
| 2015/0116295 A1 | 4/2015 | Pyon | |
| 2015/0318305 A1 | 11/2015 | Zhang et al. | |
| 2016/0314746 A1 | 10/2016 | Ho | |
| 2017/0316739 A1 | 11/2017 | Oh et al. | |
| 2017/0337873 A1 | 11/2017 | Kim et al. | |
| 2017/0338295 A1 | 11/2017 | Lee et al. | |
| 2018/0006098 A1 | 1/2018 | Hong et al. | |
| 2018/0197476 A1 | 7/2018 | Xi et al. | |
| 2019/0066592 A1* | 2/2019 | Kim | .................... H01L 27/3276 |
| 2019/0164483 A1 | 5/2019 | Ling et al. | |

FOREIGN PATENT DOCUMENTS

| | | |
|---|---|---|
| CN | 106157882 A | 11/2016 |
| CN | 107481668 I | 12/2017 |
| CN | 107945737 A | 4/2018 |
| CN | 208173203 U | 11/2018 |
| EP | 3246912 A2 | 11/2017 |
| JP | 2005331919 A | 12/2005 |
| JP | 2009169410 A | 7/2009 |

OTHER PUBLICATIONS

Japanese Office Action dated Nov. 8, 2022; Appln. No. 2019-570479.

* cited by examiner

DISPLAY PANEL AND DISPLAY DEVICE

CROSS-REFERENCE TO RELATED APPLICATION

The present application claims priority of Chinese Patent Application No. 201820812831.2, filed on May 29, 2018, the disclosure of which is incorporated herein by reference in its entirety as part of the present application.

TECHNICAL FIELD

The embodiments of the present disclosure relate to a display panel and a display device.

BACKGROUND

In a field of display, organic light-emitting diode (OLED) display panels have the characteristics of self-illumination, high contrast, low energy consumption, wide viewing angle, fast response speed, being applicable to a flexible panel, wide temperature range of use, simple manufacture, and the like, and have broad development prospects.

SUMMARY

Embodiments of the present disclosure provide a display panel and a display device, the display panel can improve both the display uniformity and the resolution, thereby improving the display quality of the display panel.

At least one embodiment of the present disclosure provides a display panel, comprising: a substrate, comprising a display area and a peripheral area on at least one side of the display area; a plurality of pixel units, in the display area, each pixel unit comprising a light-emitting unit and a pixel circuit structure for providing a driving current to the light-emitting unit, and the light-emitting unit being an electroluminescent element; a functional signal line, connected with the pixel circuit structure of each pixel unit and providing a common voltage signal for the pixel circuit structure; and a first conductive structure, connected in parallel with the functional signal line and located at a layer different from that of the functional signal line.

In some embodiments, the plurality of pixel units extend along a row direction and a column direction to form a plurality of rows of pixel units and a plurality of columns of pixel units, the functional signal line comprises a first signal line extending along a first direction, and the first signal line extends along a row of pixel units or a column of pixel units.

In some embodiments, the functional signal line comprises a second signal line extending along a second direction, the second signal line is in the peripheral area, the second signal line is connected with the first signal line, and the second direction intersects the first direction.

In some embodiments, the second signal line is connected with a signal input circuit.

In some embodiments, the first conductive structure comprises a first conductive line extending along the first direction, and the first conductive line extends along a row of pixel units or a column of pixel units.

In some embodiments, the first conductive structure comprises a second conductive line extending along the second direction, the second conductive line is in the peripheral area, and the second conductive line is connected with the first conductive line.

In some embodiments, the second conductive line and the first conductive line are in different layers.

In some embodiments, the display panel further comprises an insulation layer between the first conductive structure and the functional signal line, the first conductive structure and the functional signal line are connected by a via hole penetrating the insulation layer located between the first conductive structure and the functional signal line.

In some embodiments, the via hole comprises at least one of a display area via hole in the display area and a peripheral area via hole in the peripheral area.

In some embodiments, in a direction perpendicular to the substrate, the first signal line and the first conductive line have a first overlapping area, the display area via hole is in the first overlapping area, and the first signal line and the first conductive line are connected through the display area via hole.

In some embodiments, in a direction perpendicular to the substrate, the second signal line and the second conductive line have a second overlapping area, the peripheral area via hole is in the second overlapping area, and the second signal line and the second conductive line are connected through the peripheral area via hole.

In some embodiments, a plurality of display area via holes are provided, and at least one display area via hole is provided for each pixel unit.

In some embodiments, a plurality of peripheral area via holes are provided, and each of the plurality of peripheral area via holes corresponds to a row of pixel units or a column of pixel units.

In some embodiments, the first conductive line is connected with the first signal line through a transfer pattern, the first conductive line and the transfer pattern are connected by a via hole penetrating through an insulation layer located between the first conductive line and the transfer pattern, and the transfer pattern and the first signal line are connected by a via hole penetrating through an insulation layer located between the transfer pattern and the first signal line.

In some embodiments, each light-emitting unit comprises a first electrode, first electrodes of different light-emitting units are insulated from each other, the first conductive structure is in a same layer as the first electrode, and the first conductive line extends in a gap between first electrodes of adjacent rows of pixel units or in a gap between first electrodes of adjacent columns of pixel units.

In some embodiments, the display panel further comprises a gate line, a data line, a first power line, and a second power line, the pixel circuit structure comprises a storage capacitor, a drive transistor, a data writing transistor, and a threshold compensation transistor, a first electrode of the storage capacitor is electrically connected with the first power line, and a second electrode of the storage capacitor is electrically connected with a second electrode of the threshold compensation transistor through a first connection electrode; a gate electrode of the data writing transistor is electrically connected with the gate line, and a first electrode and a second electrode of the data writing transistor are electrically connected with the data line and a first electrode of the drive transistor, respectively; a gate electrode of the threshold compensation transistor is electrically connected with the gate line, and a first electrode and a second electrode of the threshold compensation transistor are electrically connected with a second electrode and a gate electrode of the drive transistor, respectively; and a second electrode of the light-emitting element is electrically connected with the second power line.

In some embodiments, the first conductive line comprises a first portion having a first width and a second portion having a second width, the first width is smaller than the second width, and in a direction perpendicular to the substrate, the second portion overlaps at least one of a channel region of the drive transistor, a channel region of the data writing transistor, and a channel region of the threshold compensation transistor.

In some embodiments, the display panel further comprises an initialization signal line, a light-emitting control signal line and a reset control signal line, the pixel circuit structure further comprises a first light-emitting control transistor, a second light-emitting control transistor, a first reset transistor and a second reset transistor; a gate electrode of the first light-emitting control transistor is electrically connected with the light-emitting control signal line, a first electrode and a second electrode of the first light-emitting control transistor are electrically connected with the first power line and the first electrode of the drive transistor, respectively; a gate electrode of the second light-emitting control transistor is electrically connected with the light-emitting control signal line, a first electrode and a second electrode of the second light-emitting control transistor are electrically connected with the second electrode of the drive transistor and a first electrode of the light-emitting element, respectively; a gate electrode of the first reset transistor is electrically connected with the reset control signal line, and a first electrode and a second electrode of the first reset transistor are electrically connected with the initialization signal line and the gate electrode of the drive transistor, respectively; and a gate electrode of the second reset transistor is electrically connected with the reset control signal line, and a first electrode and a second electrode of the second reset transistor are electrically connected with the initialization signal line and the first electrode of the light-emitting element, respectively.

In some embodiments, the pixel circuit structure further comprises a first stabilization capacitor between the data line and the first power line, the first stabilization capacitor comprises a first capacitor electrode; the gate line, the gate electrode of the drive transistor, and the second electrode of the storage capacitor are in a same layer; the first capacitor electrode, the initialization signal line, and the first electrode of the storage capacitor are in a same layer; the data line, the first power line, and the first connection electrode are in a same layer; and the first capacitor electrode and the data line overlap each other in a direction perpendicular to the substrate.

In some embodiments, the functional signal line comprises at least one of the initialization signal line, the first power line, and the second power line.

In some embodiments, the gate line, the light-emitting control signal line and the reset control signal line are in a first conductive pattern layer; the first signal line is in a second conductive pattern layer; the data line, the first power line, and the second signal line are in a third conductive pattern layer; the first electrode, the first conductive line, and the second conductive line are in a fourth conductive pattern layer; and the first signal line and the second signal line constitute the initialization signal line, and the first conductive line and the second conductive line constitute the first conductive structure.

In some embodiments, the threshold compensation transistor and the first reset transistor are metal oxide semiconductor thin film transistors.

In some embodiments, the display panel further comprises a second conductive structure, the functional signal line is the initialization signal line, the second conductive structure is connected in parallel with the first power line, and the second conductive structure is between the third conductive pattern layer and the fourth conductive pattern layer.

In some embodiments, the pixel circuit structure further comprises at least one of a second stabilization capacitor and a third stabilization capacitor, the second stabilization capacitor is provided between the data line and the first electrode of the drive transistor, and the third stabilization capacitor is provided between the first power line and the first electrode of the drive transistor.

The embodiments of the present disclosure further provide a display device, comprising a display panel provided by at least one embodiment of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
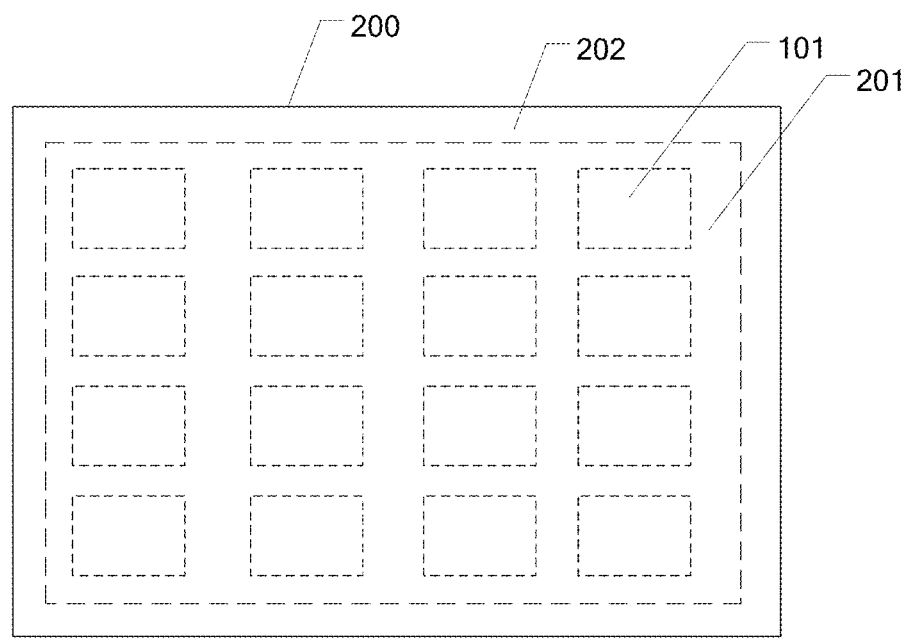
FIG. 1A is a top schematic diagram of a display panel provided by at least one embodiment of the present disclosure.

The technical solutions of the embodiments will be described in a clearly and fully understandable way below in connection with the accompanying drawings, referring to the non-limiting exemplary embodiments illustrated in the accompanying drawings and detailed in the following description, the exemplary embodiments of the present disclosure and their various features and advantageous details are more fully described. It should be noted that, the features shown in figures are not necessarily to be drawn in a real scale. The description of the known material(s), component(s) and process technology can be omitted in the present disclosure, so that the exemplary embodiments of the present disclosure are not obscured. The examples provided are merely intended to be beneficial for understanding of the implementation of the exemplary embodiments of the present disclosure, and further enable one of ordinary skill in the art to which the present disclosure belongs to implement the exemplary embodiments. Therefore, the examples should not be construed as a limitation of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly. In addition, in respective embodiments of the present disclosure, the same or similar reference numerals denote the same or similar components.

As display products become more and more widely used, consumers are increasingly demanding the display quality such as the display uniformity and the resolution. For example, reasons for the display unevenness is as follows: a voltage input end terminal of a wire has a significant voltage drop (IR drop) effect compared with a voltage input start terminal, which is likely to cause a problem of signal delay, resulting in uneven display of the display panel. For example, increasing the size of the wire is a simple method to improve the display uniformity, however increasing the size of the wire is disadvantageous to the resolution improvement. A method of improving the resolution is to reduce the size of the circuit structure, such as reducing the line width, however, reducing the line width will aggravate the display unevenness, meanwhile, reducing the line width also results in a decrease in process yield. Currently, a circuit structure of an OLED is more complicated than a circuit structure of a liquid crystal display (LCD), and the resolution improvement space is limited. Therefore, a new design needs to be provided to meet the requirements of high resolution and display uniformity.

A display panel provided by at least one embodiment of the present disclosure can improve the display uniformity of the display panel and improve the resolution of the display panel.

FIG. 1A is a top schematic diagram of a display panel provided by at least one embodiment of the present disclosure. The display panel comprises: a substrate 200 and a plurality of pixel units 101. The substrate 200 comprises a display area 201 and a peripheral area 202 on at least one side of the display area 201, the plurality of pixel units 101 are located in the display area 201. FIG. 1A shows the setting mode that the peripheral area 202 surrounds the display area 201, but the present disclosure is not limited thereto. The number and arrangement of the pixel units 201 are not limited to those shown in the drawings.

Figure 1B:
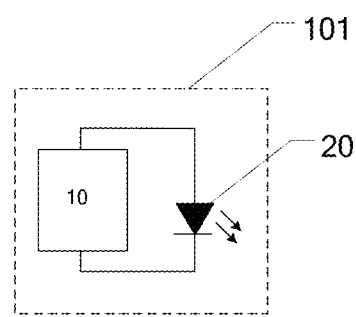
FIG. 1B is a schematic diagram of a pixel unit in a display panel provided by at least one embodiment of the present disclosure.

FIG. 1B is a schematic diagram of a pixel unit in a display panel provided by at least one embodiment of the present disclosure. As shown in FIG. 1B, each pixel unit 101 comprises a light-emitting unit 20 and a pixel circuit structure 10 for providing a driving current to the light-emitting unit 20, and the light-emitting unit 20 can be an electroluminescent element, for example, an organic electroluminescent element, such as an organic light-emitting diode (OLED). For example, a driving principle of the electroluminescent element is as follows: the electroluminescent element is driven by current, and the magnitude of the current determines the display grayscale, therefore, in a case where different pixels are controlled under the same driving signal, the voltage drops of the functional signal lines of the pixels at different positions are different, so as to cause a current difference, and the current difference may cause the display unevenness.

Figure 1C:
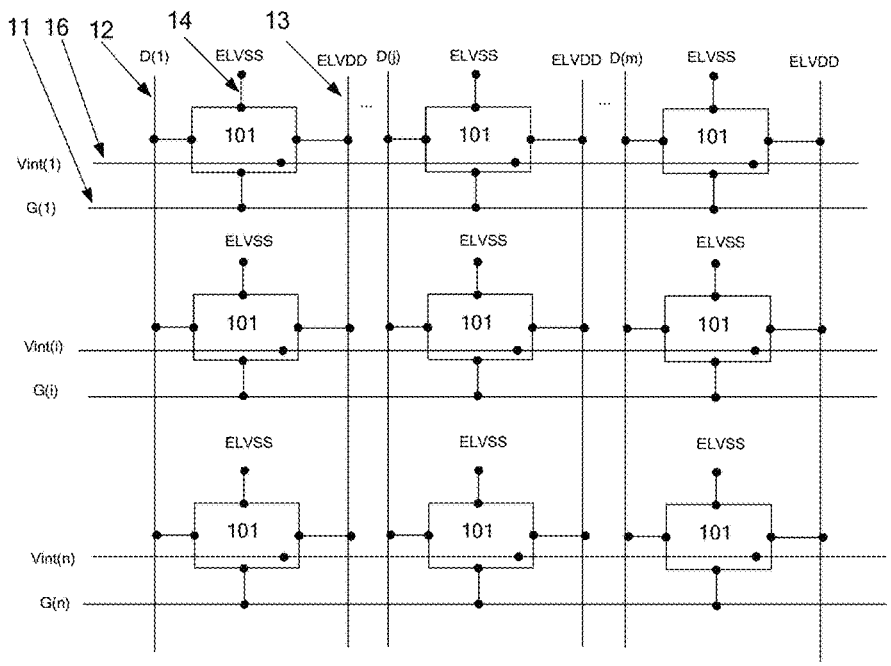
FIG. 1C is a schematic diagram of signal lines for providing signals for each pixel unit in a display panel provided by at least one embodiment of the present disclosure.

FIG. 1C is a schematic diagram of signal lines for providing signals for each pixel unit in a display panel provided by at least one embodiment of the present disclosure. FIG. 1C shows a gate line 11, a data line 12, a first power line 13, a second power line 14, and an initialization signal line 16. For example, the gate line 11 is configured to provide a scan signal Scan to the pixel circuit structure 10, the data line 12 is configured to provide a data signal Data to the pixel circuit structure 10, the first power line 13 is configured to provide a constant first voltage signal ELVDD to the pixel circuit structure 10, the second power line 14 is configured to provide a constant second voltage signal ELVSS to the pixel circuit structure 10, and the first voltage signal ELVDD is larger than the second voltage signal ELVSS. The initialization signal line 16 is configured to provide an initialization signal Vint to the pixel circuit structure 10. The initialization signal Vint is a constant voltage signal, a magnitude of the initialization signal Vint may be, for example, between the first voltage signal ELVDD and the second voltage signal ELVSS, but the present disclosure is not limited thereto, for example, the initialization signal Vint may be less than or equal to the second voltage signal ELVSS. For example, signal lines such as the first power line 13, the second power line 14, and the initialization signal line 16 may have the above signal delay problem.

Figure 2:
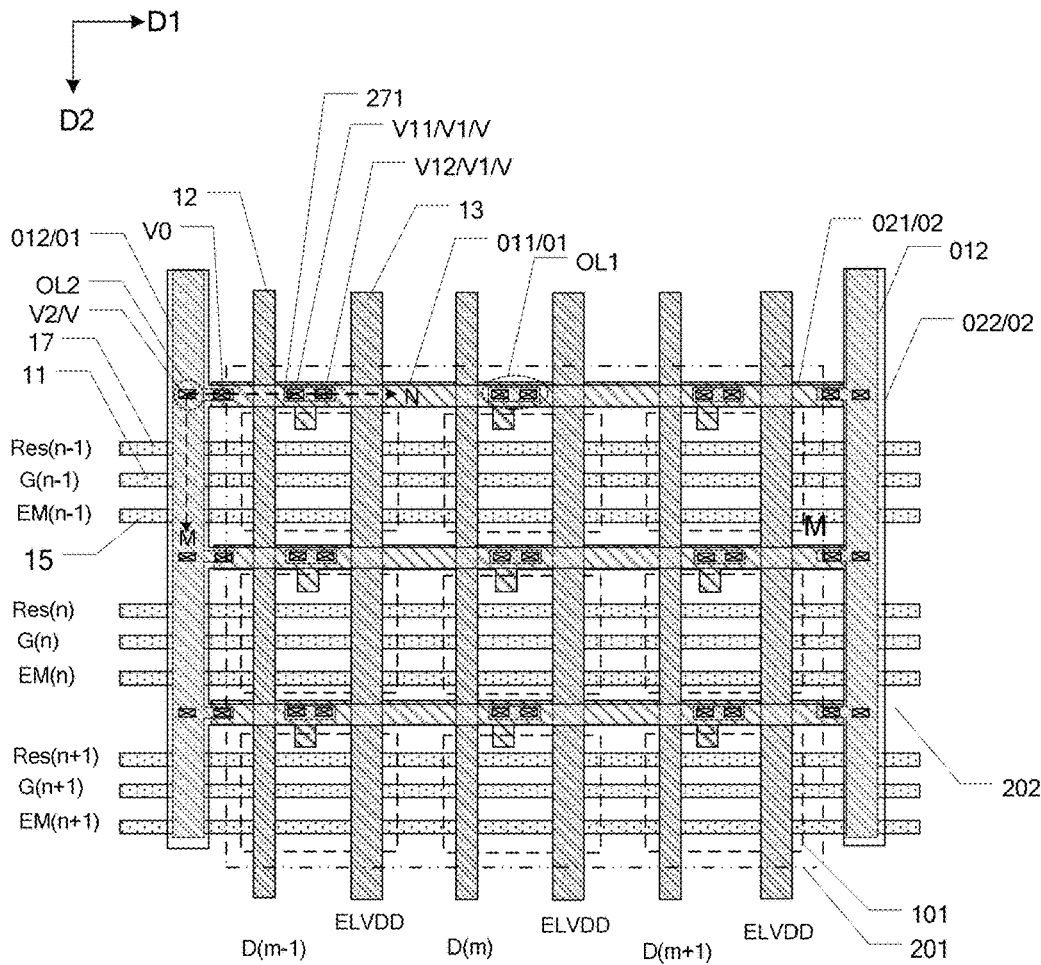
FIG. 2 is a top schematic diagram of a display panel provided by at least one embodiment of the present disclosure.

FIG. 2 is a top schematic diagram of a display panel provided by at least one embodiment of the present disclosure. The display panel further comprises a functional signal line 01. The functional signal line 01 is connected with the pixel circuit structure 10 of each pixel unit 101 and provides a common voltage signal for the pixel circuit structure 10. For example, the common voltage signal may be a constant voltage signal.

As shown in FIG. 2, the display panel further comprises a first conductive structure 02. The first conductive structure 02 is connected in parallel with the functional signal line 01 and is located at a layer different from that of the functional signal line 01. For example, the arrangement mode that the first conductive structure 02 and the functional signal line are at different layers may facilitate a case where the first conductive structure 02 and the functional signal line are connected in parallel via holes.

In the display panel provided by the embodiment of the present disclosure, the first conductive structure 02 is connected in parallel with the functional signal line 01 to reduce the resistance of the functional signal line, so that the signal delay problem caused by the resistance problem of the functional signal line is weakened. Meanwhile, because the first conductive structure 02 and the functional signal line 01 are connected in parallel to weaken the signal delay problem, the functional signal line with a larger width may not need to be used, which can help to improve the resolution. Therefore, the display panel provided in the embodiment of the present disclosure can improve both the display uniformity and the resolution, thereby improving the display quality.

For example, as shown in FIG. 2, the plurality of pixel units 101 extend along a row direction and a column direction to form a plurality of rows of pixel units and a plurality of columns of pixel units. FIG. 2 shows three rows of pixel units and three columns of pixel units, and the embodiment of the present disclosure will be described by taking this case as an example. For example, the row direction is a horizontal direction, and the column direction is a vertical direction. The functional signal line 01 comprises a first signal line 011 extending along a first direction D1, and the first signal line 011 extends along a row of pixel units. For example, the first signal line 011 is located in the display area 201.

For example, as shown in FIG. 2, in order to further reduce the resistance, the functional signal line 01 further comprises a second signal line 012 extending along a second direction D2, the second signal line 012 is located in the peripheral area 202, the second signal line 012 is connected with the first signal line 011, and the second direction D2 intersects the first direction D1. Furthermore, for example, the second direction D2 is perpendicular to the first direction D1. As shown in FIG. 2, the first signal line 011 and the second signal line 012 are disposed in different layers, and are electrically connected by a via hole penetrating an insulation layer. Certainly, the first signal line 011 and the second signal line 012 can also be disposed in the same layer.

For example, as shown in FIG. 2, the first conductive structure 02 comprises a first conductive line 021 extending along the first direction D1, and the first conductive line 021 extends along a row of pixel units. For example, the first conductive line 021 is located in the display area.

For example, as shown in FIG. 2, in order to further reduce the resistance, the first conductive structure 02 further comprises a second conductive line 022 extending along the second direction D2, the second conductive line 022 is located in the peripheral area 202, and the second conductive line 022 is connected with the first conductive line 021. As shown in FIG. 2, the first conductive line 021 and the second conductive line 022 are disposed in the same layer. Of course, the first conductive line 021 and the second conductive line 022 may also be disposed in different layers and are electrically connected through a via hole penetrating an insulation layer.

An insulation layer may be disposed between different conductive pattern layers. For example, as shown in FIG. 2, the display panel further comprises an insulation layer (not shown in FIG. 2, referring to FIG. 3), and the insulation layer is located between the first conductive structure 02 and the functional signal line 01, and the first conductive structure 02 and the functional signal line 01 are connected by a via hole V penetrating the insulation layer.

For example, as shown in FIG. 2, the via hole V comprises at least one of a display area via hole V1 in the display area and a peripheral area via hole V2 in the peripheral area.

For example, as shown in FIG. 2, in the top view of the display panel, the first signal line 011 and the first conductive line 021 have a first overlapping area OL1, the display area via hole V1 is located in the first overlapping area OL1, and the first signal line 011 and the first conductive line 021 are connected through the display area via hole V1. It should be noted that, in the embodiment of the present disclosure, "in the top view of the display panel" may also be regarded as being in a direction perpendicular to the substrate 200.

For example, in the embodiment of the present disclosure, the direction perpendicular to the substrate 200 may be a thickness direction of the substrate 200 or a direction perpendicular to a main surface of the substrate 200. For example, the top view of the display panel is a view obtained by performing orthographic projection on the display panel from the top to the bottom of the display panel.

For example, as shown in FIG. 2, in order to further reduce the resistance of the functional signal line, the number of the display area via holes V1 is plural, and at least one display area via hole V1 is provided for each pixel unit 101. For example, the number of the display area via holes V1 may be at least the same as the number of the pixel units. For example, the number of the display area via holes may be at least one time (such as, twice) the number of the pixel units.

For example, as shown in FIG. 2, in the top view of the display panel, the second signal line 012 and the second conductive line 022 have a second overlapping area OL2, the peripheral area via hole V2 is in the second overlapping area OL2, and the second signal line 012 and the second conductive line 022 are connected through the peripheral area via hole V2.

For example, as shown in FIG. 2, in order to further reduce the resistance of the functional signal line, the number of peripheral area via holes V2 is plural. For example, every two of the plurality of peripheral area via holes V2 corresponds to a row of pixel units.

In FIG. 2, a case that the first conductive structure 02 and the functional signal line 01 are connected in parallel through the display area via hole V1 and the peripheral area via hole V2 is taken as an example to describe. It should be noted that, the first conductive structure 02 and the functional signal line 01 may be connected in parallel only through the display area via hole V1, or the first conductive structure 02 and the functional signal line 01 may be connected in parallel only through the peripheral area via hole V2. Also, the arrangement of the display area via hole V1 and the peripheral area via hole V2 is not limited to the case shown in FIG. 2.

Figure 3:
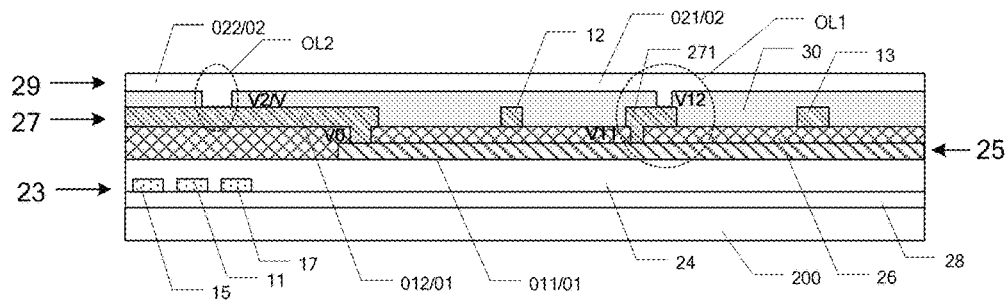
FIG. 3 is a cross-sectional view taken along a line M-N in FIG. 2.

For example, as shown in FIG. 2, in order to be compatible with the patterning process and to reduce the difficulty in fabricating the via holes, the first conductive line 021 can be connected with the first signal line 011 through a transfer pattern 271, the first signal line 011 and the transfer pattern 271 are connected by a via hole V11 penetrating through an insulation layer located between the first signal line 011 and the transfer pattern 271, and the transfer pattern 271 and the first conductive line 021 are connected by a via hole V12 penetrating through an insulation layer located between the transfer pattern 271 and the first conductive line 021 (also referring to FIG. 3). Of course, the transfer pattern 271 may not be provided, and the embodiment of the present disclosure does not limit this.

FIG. 3 is a cross-sectional view taken along a line M-N in FIG. 2. As shown in FIG. 3, the functional signal line 01 comprises a first signal line 011 and a second signal line 012, the first signal line 011 and the second signal line 012 are electrically connected by a via hole V0 penetrating through an interlayer insulation layer 26. In the peripheral area, the second conductive line 022 and the second signal line 012 are electrically connected by a via hole V2 penetrating through an insulation layer 30 located between the second conductive line 022 and the second signal line 012 (functional signal line 01). In the display area, the transfer pattern 271 and the first signal line 011 are connected by a via hole V11 penetrating through an interlayer insulation layer 26 located between the first signal line 011 and the transfer pattern 271, and the second conductive line 021 and the transfer pattern 271 are electrically connected by a via hole V12 penetrating the insulation layer 30 located between the second conductive line 021 and the transfer pattern 271. FIG. 3 also shows the substrate 200 and a buffer layer 20 thereon. FIG. 3 also shows the first overlapping area OL1 and the second overlapping area OL2.

FIGS. 4A-4D are top schematic diagrams of each of four conductive pattern layers of FIG. 2, respectively. Please refer to FIG. 2 and FIGS. 4A-4D, the display panel comprises a first conductive pattern layer 23, a second conductive pattern layer 25, a third conductive pattern layer 27, and a fourth conductive pattern layer 29.

Figure 4A:
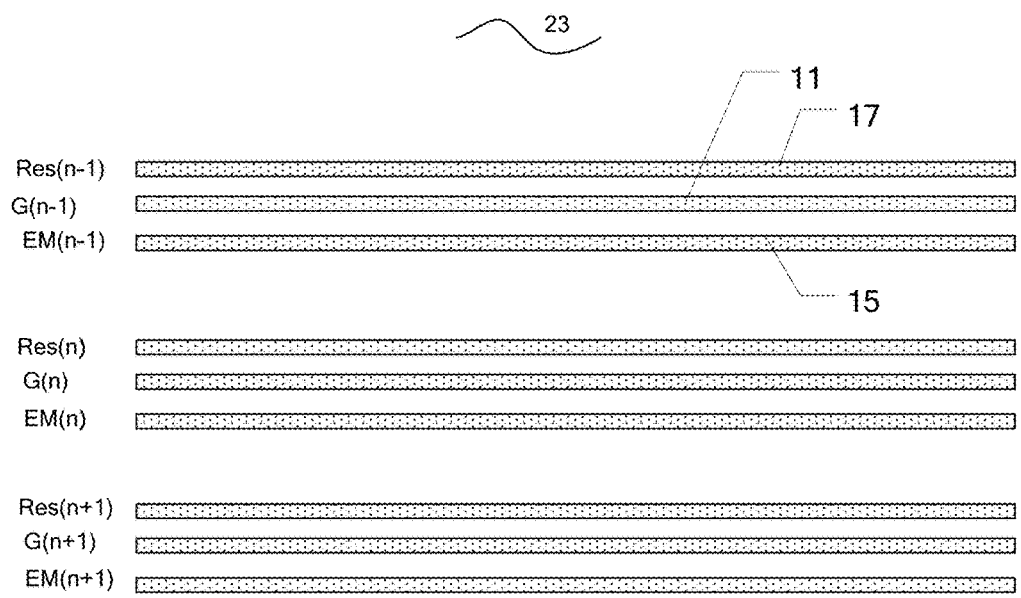
FIGS. 4A-4D are top schematic diagrams of each of four conductive pattern layers of FIG. 2, respectively.

As shown in FIG. 4A, the first conductive pattern layer 23 comprises the gate line 11, the light-emitting control signal line 15, and the reset control signal line 17.

Figure 4B:
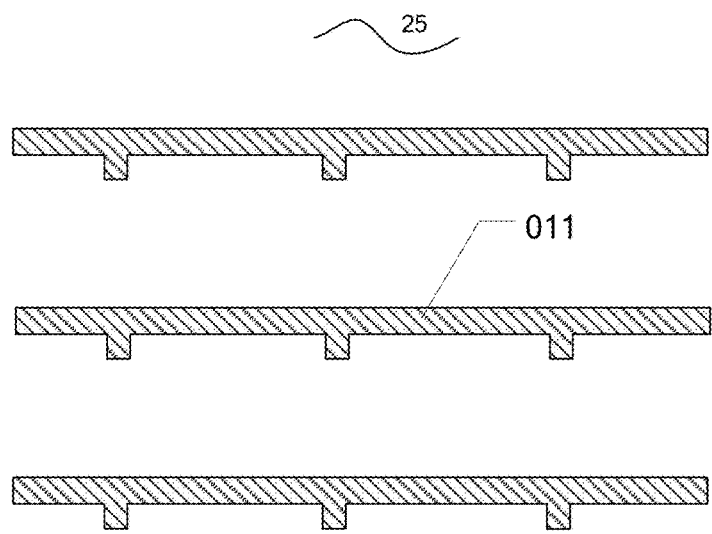

As shown in FIG. 4B, the second conductive pattern layer 25 comprises the first signal line 011. As shown in FIG. 4A and FIG. 4B, an extending direction of the first signal line 011 is the same as an extending direction of the gate line 11. A plurality of first signal lines 011 are spaced apart from each other. For example, each of the first signal lines 011 may correspond to a row of pixel units.

Figure 4C:
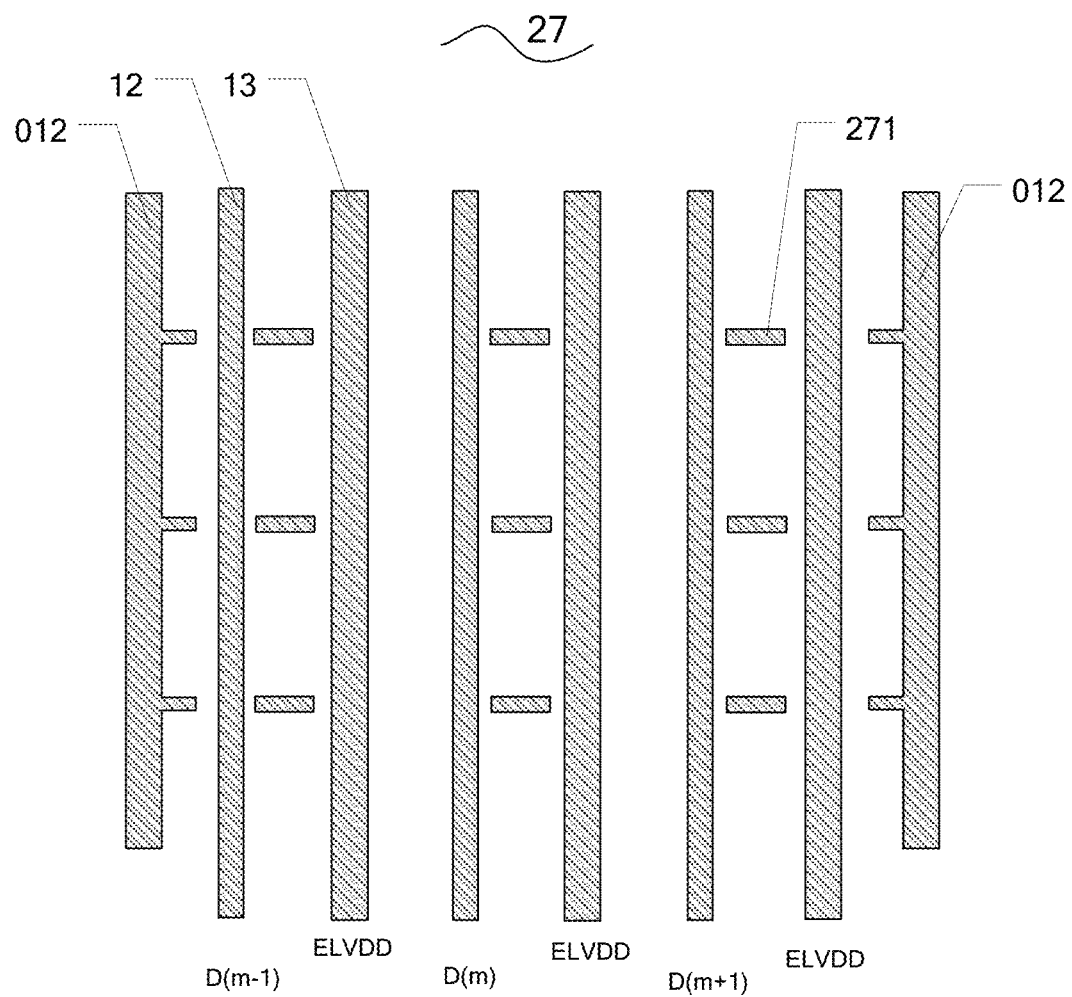

As shown in FIG. 4C, the third conductive pattern layer 27 comprises the second signal line 012, the data line 12, the first power line 13, and the transfer pattern 271. For example, an extending direction of the second signal line 012 is the same as an extending direction of the data line 12. For example, the data line 12 may corresponds to a column of pixel units, and the first power line 12 may corresponds to a column of pixel units.

Figure 4D:
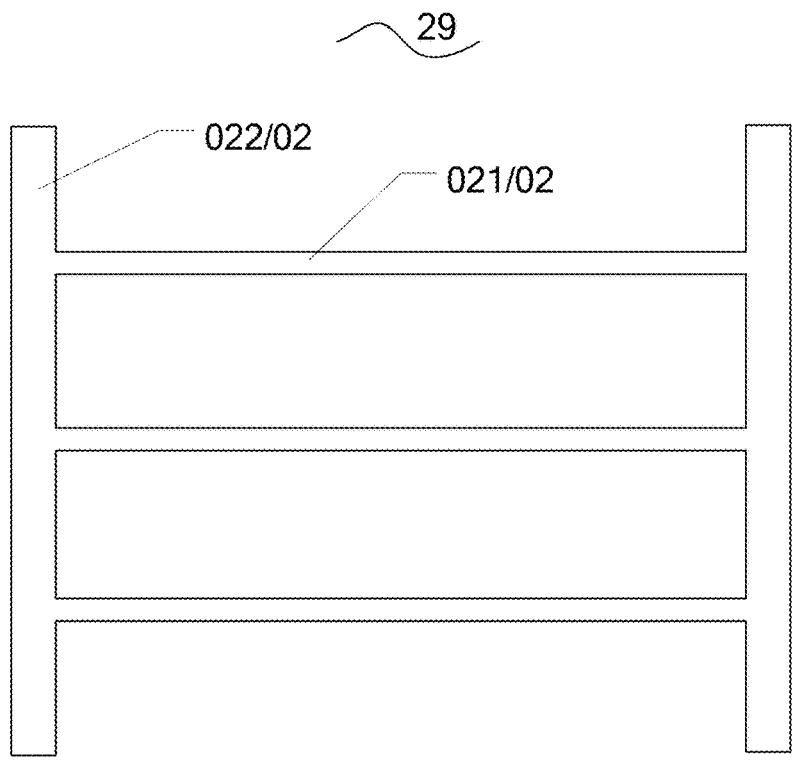

As shown in FIG. 4D, the fourth conductive pattern layer 29 comprises the first conductive structure 02, the first conductive structure 02 comprises the first conductive line 021 and the second conductive line 022 that are electrically connected. For example, the first conductive line 021 and the second conductive line 022 may be formed in the same layer, of course, may also be in different layers and be electrically connected through a via hole penetrating an insulation layer. For example, in an embodiment, the first conductive line 021 and a first electrode 2001 (referring to FIG. 7) are in the same layer, and the second conductive line 022 and a portion of the initialization signal line 16 located in the peripheral area are in the same layer.

For example, the functional signal line 01 in FIG. 2 may be the initialization signal line 16 in the pixel circuit structure. Of course, the functional signal line 01 may also be the first power line 13, which will be described in detail in FIG. 6A. The initialization signal line 16 may comprise a portion located in the display area (which may correspond to the first signal line 011) and a portion located in the peripheral area (which may be correspond to the second signal line 012).

Figure 5:
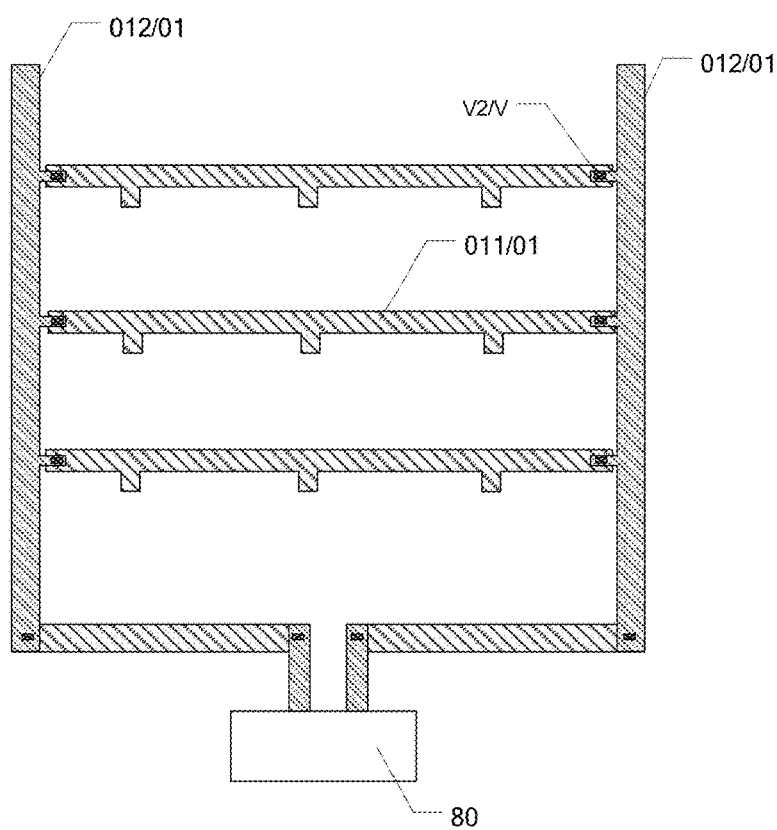
FIG. 5 is a schematic diagram of a connection between a functional signal line and a signal input circuit in a display panel provided by an embodiment of the present disclosure.

FIG. 5 is a schematic diagram of a connection between a functional signal line and a signal input circuit in a display panel provided by an embodiment of the present disclosure. As shown in FIG. 5, the second signal line 012 is connected with a signal input circuit 80. For example, as shown in FIG. 5, the second signal line 012 and the first signal line 011 are located in different layers, and are connected through a via hole V2.

As shown in FIG. 5, a portion of the functional signal line 01 close to the signal input circuit 80 may be a voltage input start terminal, and a portion of the functional signal line 01 away from the signal input circuit 80 may be a voltage input end terminal, because, in the embodiment of the present disclosure, the first conductive structure 02 is connected in parallel with the functional signal line 01, the signal delay problem caused by the voltage drop effect between the voltage input end terminal and the voltage input start end can be reduced. Meanwhile, because the signal delay problem can be reduced, so that the signal line with a larger width may not need to be used, thereby being advantageous to improve the resolution of the display panel, and thus being advantageous to improve the display quality.

Figure 6A:
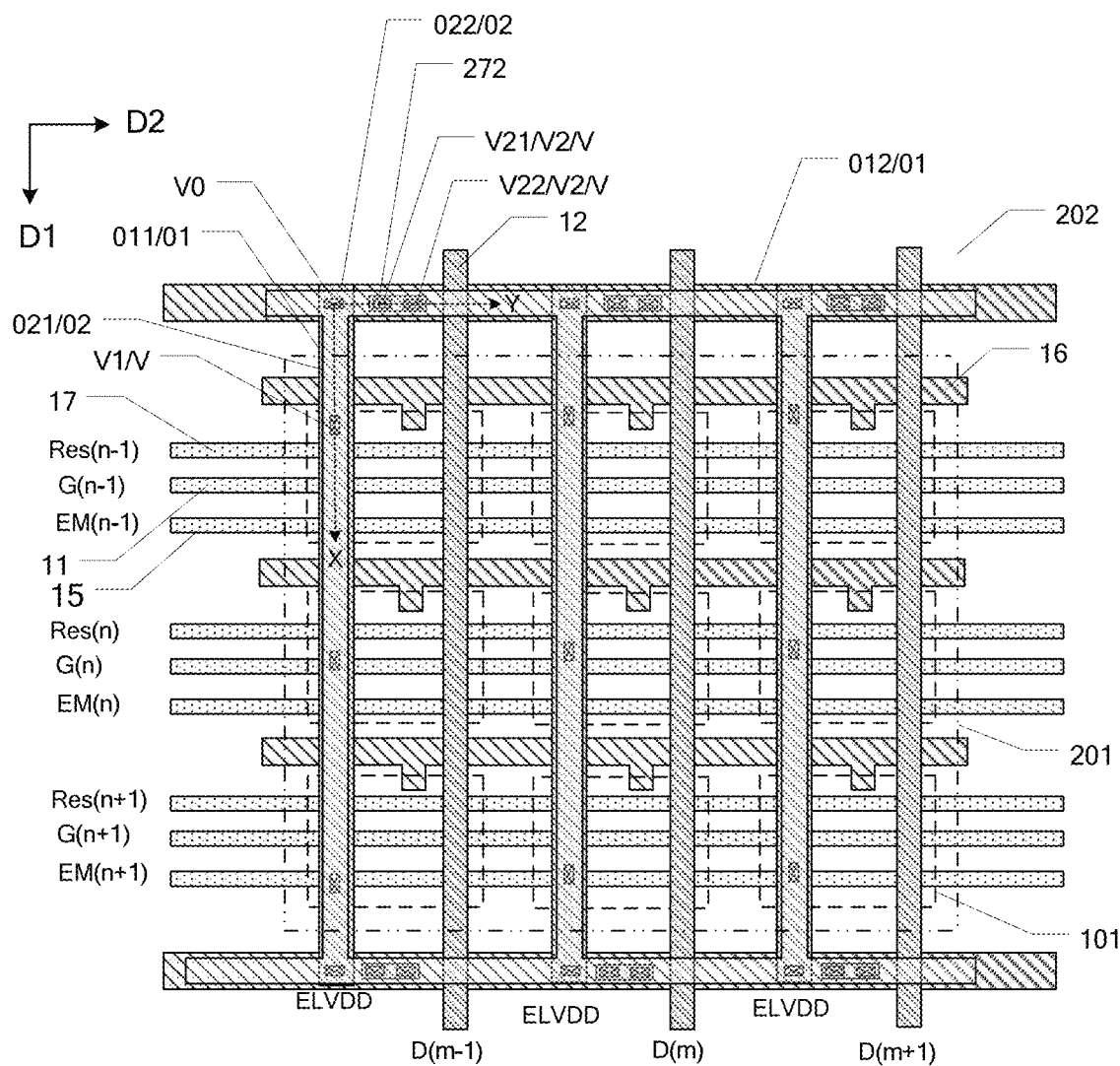
FIG. 6A is a top schematic diagram of a display panel provided by another embodiment of the present disclosure.

FIG. 6A is a top schematic diagram of a display panel provided by another embodiment of the present disclosure. As shown in FIG. 6, the first signal line 011 extends along a column of pixel units, the first conductive line 021 extends along a column of pixel units, and every four of the plurality of peripheral area via holes V2 correspond to a column of pixel units. As shown in FIG. 6A, the second signal line 012 extends along a row of pixel units, and the second conductive line 022 extends along a row of pixel units.

Figure 6B:
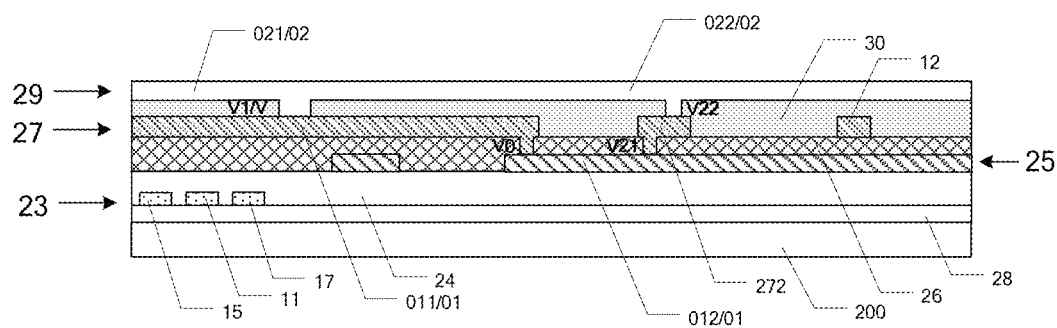
FIG. 6B is a cross-sectional view taken along a line X-Y in FIG. 6A.

FIG. 6B is a cross-sectional view taken along a line X-Y in FIG. 6A. As shown in FIG. 6A and FIG. 6B, the first signal line 011 and the second signal line 012 are electrically connected with each other through the via hole V0 of the interlayer insulation layer 26 therebetween to constitute the functional signal line 01. The first conductive line 021 and the first signal line 011 are electrically connected by the display area via hole V1 penetrating through the insulation layer 30 therebetween. The transfer pattern 272 and the second signal line 012 are electrically connected by a via hole V21 (the peripheral area via hole V2) penetrating through the interlayer insulation layer 26 located therebetween. The second conductive line 022 and the transfer pattern 272 are electrically connected by a via hole V22 (the peripheral area via hole V2) penetrating through the insulation layer 30 located therebetween.

Figure 7:
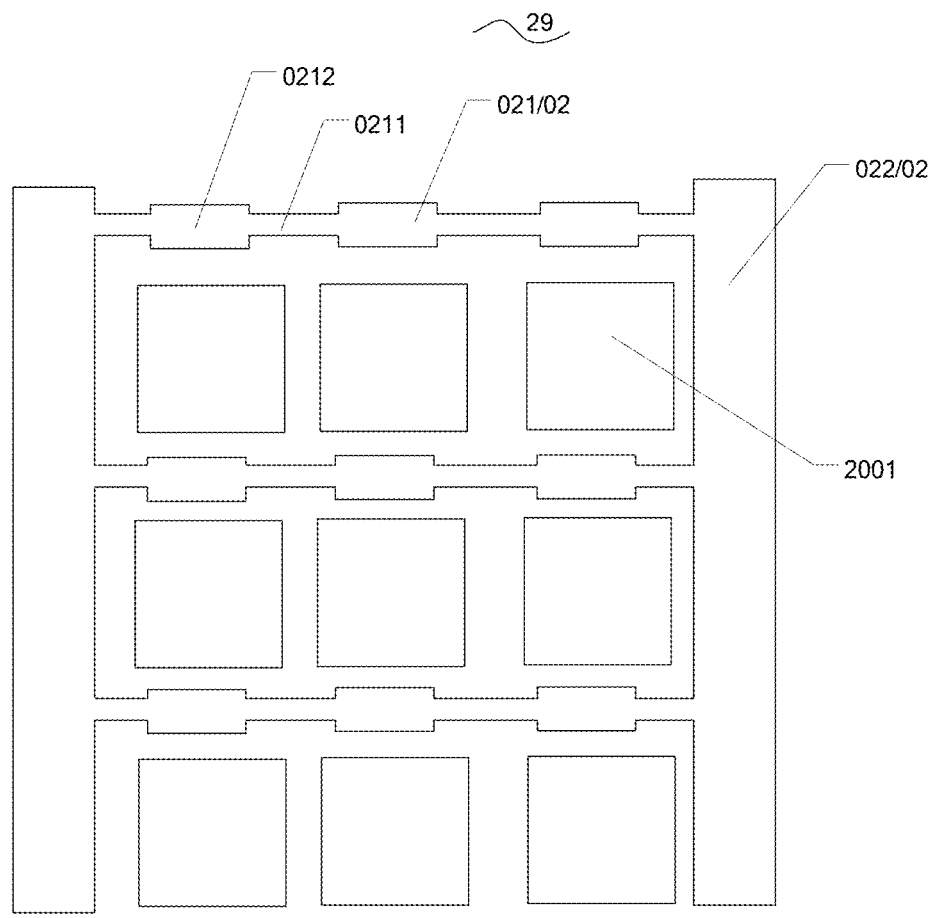
FIG. 7 is a schematic diagram of a fourth conductive pattern layer in a display panel provided by an embodiment of the present disclosure.

FIG. 7 is a schematic diagram of a fourth conductive pattern layer in a display panel provided by an embodiment of the present disclosure. For example, as shown in FIG. 7, each light-emitting unit (for example, an organic electroluminescent diode) comprises a first electrode 2001, first electrodes 2001 of different light-emitting units are insulated from each other, and the first conductive structure 02 and the first electrode 2001 are is in the same layer. The first conductive structure 02 comprises the first conductive line 021 and the second conductive line 022 which are electrically connected and in the same layer.

Figure 8:
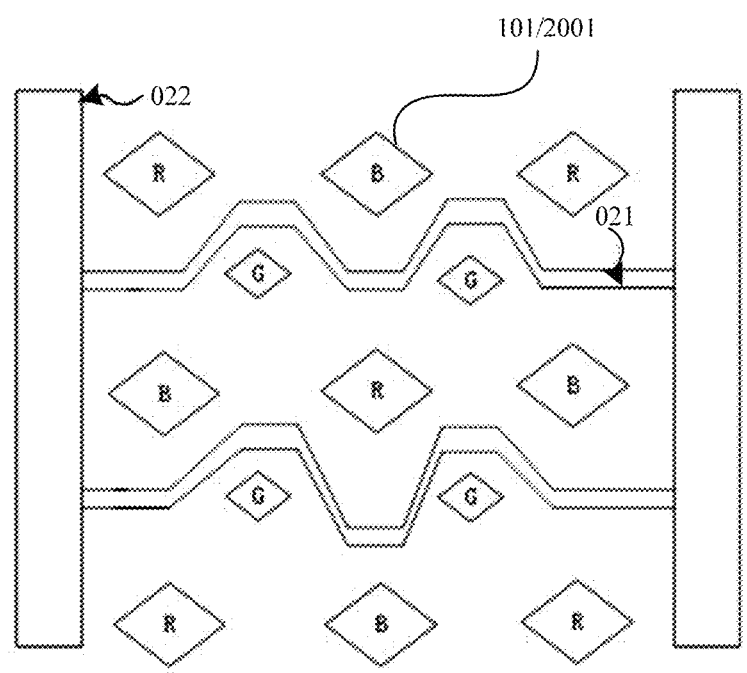
FIG. 8 is a schematic diagram of a first conductive line in a display panel provided by an embodiment of the present disclosure.

FIG. 8 is a schematic diagram of a first conductive line in a display panel provided by an embodiment of the present disclosure. As shown in FIG. 8, the first conductive line 021 extends in a gap between first electrodes 2001 of adjacent rows of pixel units 101. Of course, similarly, the first conductive line 021 may also extend in a gap between first electrodes 2001 of adjacent columns of pixel units 101. As shown in FIG. 8, the first conductive line 021 and the second conductive line 022 are in different layers. For example, one of the first conductive line 021 and the second conductive line 022 may be in the same layer as the first electrode 2001, and the other of the first conductive line 021 and the second conductive line 022 may be disposed in the same layer as the other conductive structures, but the present disclosure is not limited thereto.

Figure 9:
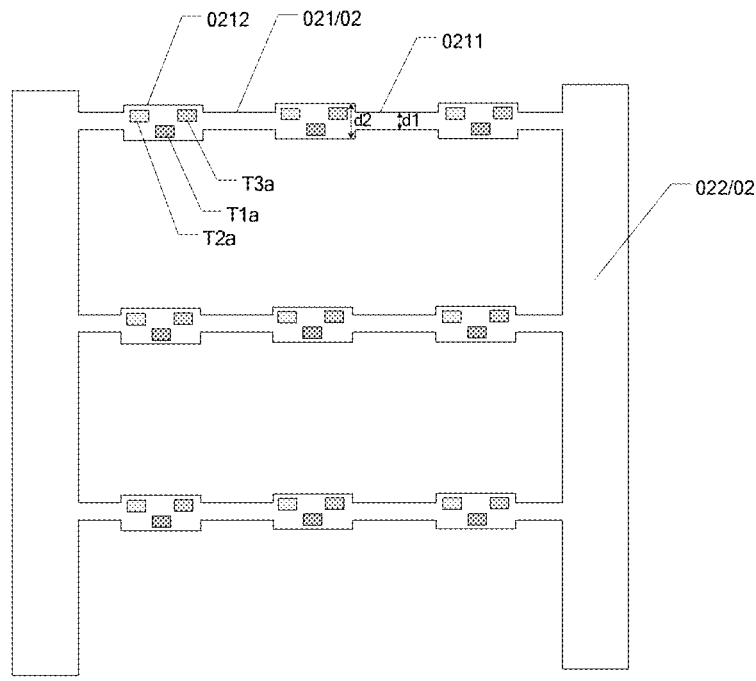
FIG. 9 is a top schematic diagram of a first signal line and channel regions of thin film transistors in a display line provided by an embodiment of the present disclosure.

FIG. 9 is a top schematic diagram of a first signal line and channel regions of thin film transistors in a display panel provided by an embodiment of the present disclosure.

Figure 11:
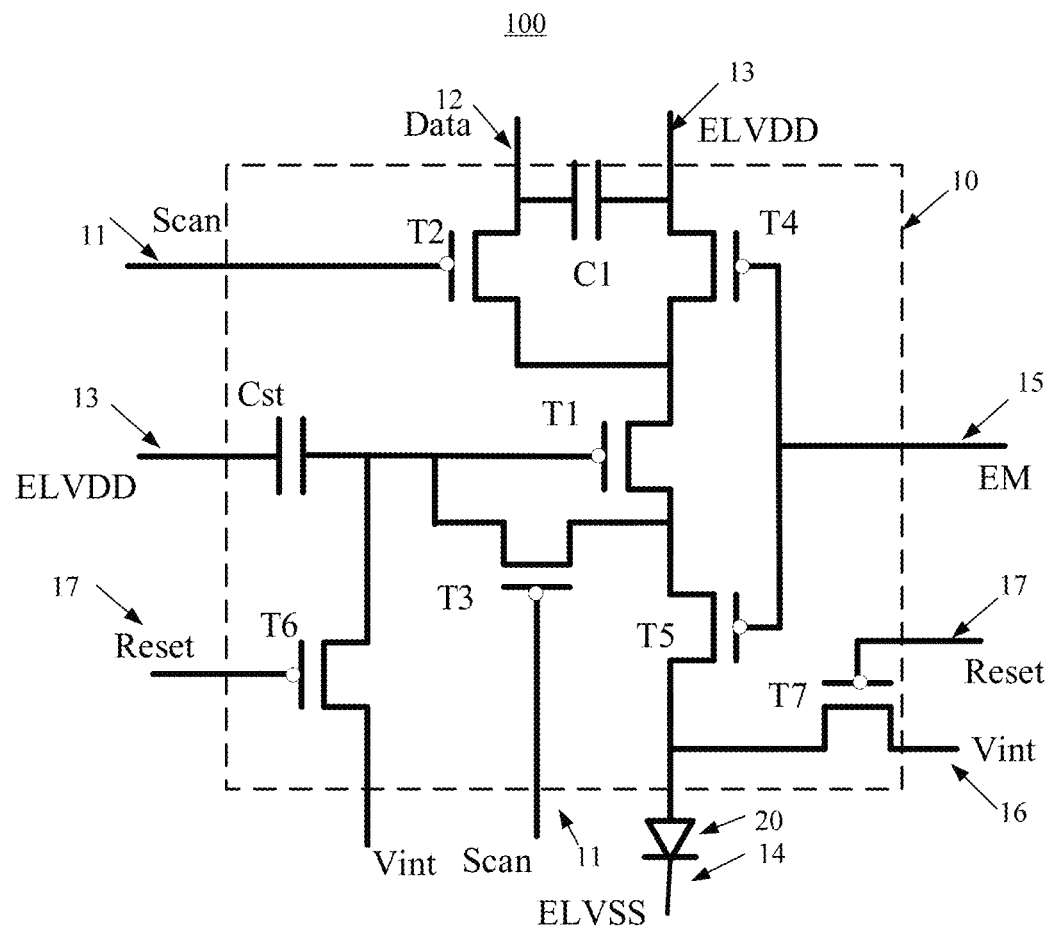
FIG. 11 is a schematic structural diagram of a display panel provided by an embodiment of the present disclosure.

For example, the first conductive line 021 comprises a first portion 0211 having a first width and a second portion 0212 having a second width, the first width d1 is smaller than the second width d2, in the top view of the display panel, the second portion 0212 may overlap at least one of a channel region T1a of a drive transistor, a channel region T2a of a data writing transistor, and a channel region T3a of a threshold compensation transistor. The drive transistor, the data writing transistor, and the threshold compensation transistor here can be referred to a drive transistor T1, a data writing transistor T2, and a threshold compensation transistor T3 (for example, as shown in FIG. 11) described below. The channel region T1a of the drive transistor, the channel region T2a of the data writing transistor and the channel region T3a of the threshold compensation transistor can also be referred to FIG. 15. The second portion of the first conductive line is used to block the channel region of the thin film transistor, so as to further improve the stability of the thin film transistor and reduce the leakage current. In FIG. 9, in the top view of the display panel, a case that the second portion 0212 overlaps with the channel region T1a of the drive transistor, the channel region T2a of the data writing transistor and the channel region T3a of the threshold compensation transistor is taken as an example to describe. In the embodiment of the present disclosure, the second portion 0212 may also overlap with one or two of the channel region T1a of the drive transistor, the channel region T2a of the data writing transistor and the channel region T3a of the threshold compensation transistor.

Figure 10:
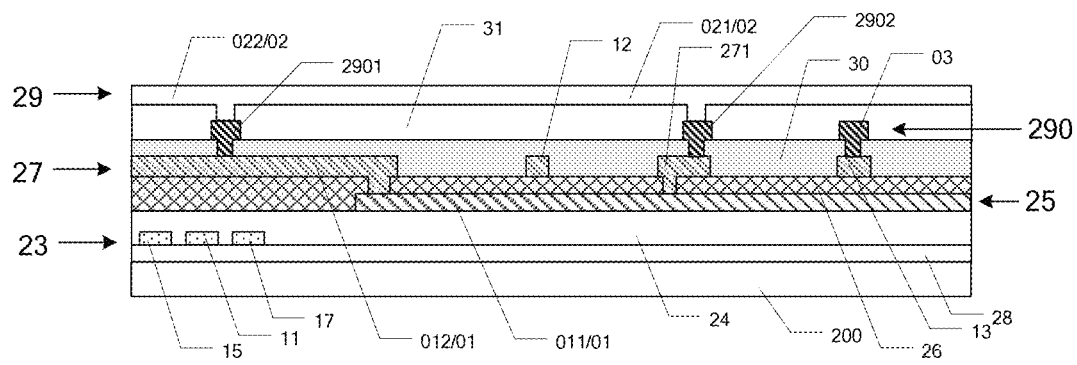
FIG. 10 is a cross-sectional schematic view of a display panel provided by an embodiment of the present disclosure.

FIG. 10 is a cross-sectional schematic view of a display panel provided by an embodiment of the present disclosure. As compared with the display panel shown in FIG. 3, the display panel further comprises a fifth conductive pattern layer 290. The fifth conductive pattern layer 290 may be located between the third conductive pattern layer 27 and the fourth conductive pattern layer 29. The fifth conductive pattern layer 290 may comprise a second conductive structure 03, in this embodiment, the functional signal line 01 is the initialization signal line 16, and the second conductive structure 03 is connected in parallel with the first power line 13. For example, in the top view of the display panel, the second conductive structure 03 may be in a grid shape.

As shown in FIG. 10, the fifth conductive pattern layer 290 may further comprise transfer patterns 2901 and 2902, to facilitate to be compatible with the patterning process and to reduce the difficulty in fabricating the via holes. FIG. 10 also shows an insulation layer 31 between the fifth conductive pattern layer 290 and the fourth conductive pattern layer 29.

The pixel circuit structure will be specifically described below. For example, the functional signal line may be one of the initialization signal line, the first power line, and the second power line. The above embodiment is described by taking a case that the functional signal line is the initialization signal line and/or the first power line as an example. It should be noted that the embodiments of the present disclosure are not limited thereto, and any signal line that provides a common voltage signal to the pixel circuit structure may be the functional signal line.

Figure 12:
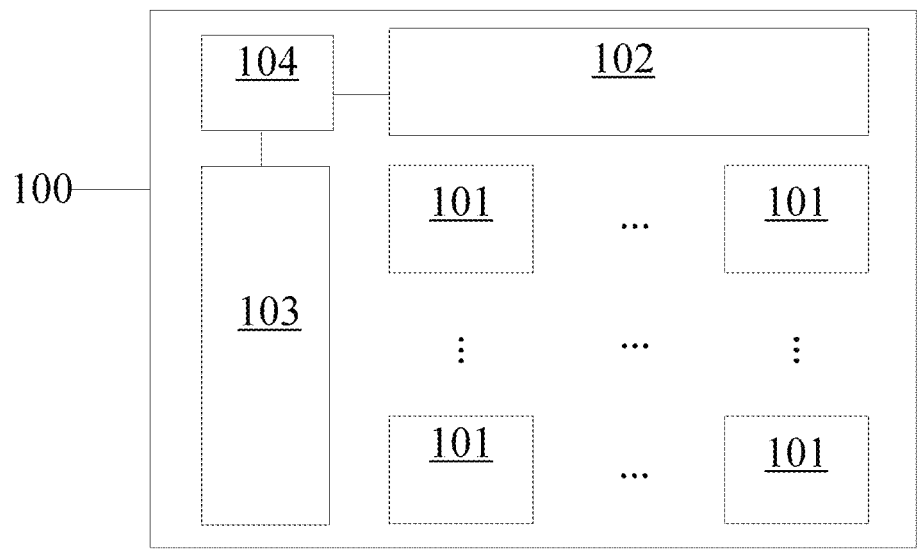
FIG. 12 is a schematic plane diagram of a display panel provided by an embodiment of the present disclosure.

FIG. 11 is a schematic structural diagram of a display panel provided by an embodiment of the present disclosure; and FIG. 12 is a schematic plane diagram of a display panel provided by an embodiment of the present disclosure. Referring to FIG. 11 and FIG. 12, the display panel 100 comprises a plurality of pixel units 101 arranged in a matrix, each of the pixel units 101 comprises a pixel circuit structure 10, a light-emitting element 20, a gate line 11, a data line 12, and a voltage signal line. The light-emitting element 20 is an organic light-emitting element OLED, and the light-emitting element 20 emits red light, green light, blue light, or white light, etc., under the driving of a corresponding pixel circuit structure 10. The voltage signal line can be one or plural. For example, as shown in FIG. 11 and FIG. 12, the voltage signal line comprises at least one of the first power line 13, the second power line 14, the light-emitting control signal line 15, the initialization signal line 16, and the reset control signal line 17.

For example, the first power line 13 is configured to provide a constant first voltage signal ELVDD to the pixel circuit structure 10, the second power line 14 is configured to provide a constant second voltage signal ELVSS to the pixel circuit structure 10, and the first voltage signal ELVDD is larger than the second voltage signal ELVSS. The light-emitting control signal line 15 is configured to provide a light-emitting control signal EM to the pixel circuit structure 10. The initialization signal line 16 and the reset control signal line 17 are respectively configured to provide an initialization signal Vint and a reset control signal Reset to the pixel circuit structure 10, the initialization signal Vint is a constant voltage signal, the magnitude of the initialization signal Vint may be, for example, between the first voltage signal ELVDD and the second voltage signal ELVSS, however the present disclosure is not limited thereto, for example, the initialization signal Vint may be less than or equal to the second voltage signal ELVSS.

As shown in FIG. 11, the pixel circuit structure 10 comprises a drive transistor T1, a data writing transistor T2, a threshold compensation transistor T3, a first light-emitting control transistor T4, a second light-emitting control transistor 15, a first reset transistor T6, a second reset transistor T7, and a storage capacitor Cst. The drive transistor T1 is electrically connected with the light-emitting element 20, and outputs a driving current under the control of signals, such as the scan signal Scan, the data signal Data, the first voltage signal ELVDD, and the second voltage signal ELVSS, and the like, to drive the light-emitting element 20 to emit light.

In the pixel unit of the organic light-emitting diode display panel, a drive transistor is connected with an organic light-emitting element, and output a driving current under the control of signals, such as a data signal, a scan signal and the like, to the organic light-emitting element, thereby driving the organic light-emitting element to emit light.

Because the magnitude of the gate voltage of the drive transistor is directly related to the magnitude of the driving current in the organic light-emitting element, the stabilization of the gate signal is an important factor for achieving stable light emitting of the organic light-emitting element and the display stability of the display panel.

In research, the inventors found that when the data signal is transmitted on the data line, the fluctuation of the data signal easily interferes with the gate signal of the drive transistor, for example, the data signal interferes with the gate signal through a parasitic capacitor formed between the data line and the gate electrode of the drive transistor, thereby affecting the stability of the gate signal.

As shown in FIG. 11, the pixel circuit structure 10 further comprise a first stabilization capacitor C1 located between the data line 12 and the first power line 13. In a case where the data signal Data on the data line 12 changes, the first stabilization capacitor C1 can reduce the interference of the parasitic capacitor between the data line 12 and the gate electrode of the drive transistor T1 on the gate signal of the drive transistor T1.

In a practical case, for example, a capacitance value of the first stabilization capacitor C1 may be designed to be greater than 10 times a capacitance value of the parasitic capacitor between the data line 12 and the gate electrode of the drive transistor T1. In a case where the capacitance value of the parasitic capacitor can be negligible compared to the first stabilization capacitor C1, the influence of the data signal Data on the gate signal through the parasitic capacitor can also be negligible.

The first stabilization capacitor C1 can have various setting modes. For example, the first stabilization capacitor may comprise a first capacitor electrode and a second capacitor electrode, the first capacitor electrode is electrically connected with the first power line 13, and the second capacitor electrode is electrically connected with the data line 12. It should be noted that, the first capacitor electrode may be a part of the first power line 13 or an electrode that is separately provided to be electrically connected with the first power line, and these two cases are included in the range of "the first capacitor electrode is electrically connected with the first power line 13". Similarly, the second capacitor electrode may be a part of the data line 12 or an electrode that is separately provided to be electrically connected with the data line 12, and these two cases are included in the range of "the second capacitor electrode is electrically connected with the data line 12".

For example, in the manufacturing process, the pixel circuit structure, which comprises a circuit layer, an insulation layer, and the like which are stacked, is prepared on a substrate of the display panel 100 by a semiconductor process. The first capacitor electrode and the second capacitor electrode may overlap each other in a direction perpendicular to the substrate of the display panel 100, and are spaced apart from each other by an insulation layer (dielectric layer), thereby constituting a capacitor. In an actual design, the capacitance value of the first stabilization capacitor C1 can be adjusted by designing a distance between the first capacitor electrode and the second capacitor electrode, a material (i.e., a dielectric constant) of the insulation layer between the first capacitor electrode and the second capacitor electrode, and an overlapping area between the first capacitor electrode and the second capacitor electrode.

As shown in FIG. 11, a first electrode of the storage capacitor Cst is electrically connected with the first power line 13, and a second electrode of the storage capacitor Cst is electrically connected with a second electrode of the threshold compensation transistor 13. A gate electrode of the data writing transistor T2 is electrically connected with the gate line 11, a first electrode and a second electrode of the data writing transistor T2 are electrically connected with the data line 12 and a first electrode of the drive transistor T1, respectively. A gate electrode of the threshold compensation transistor T3 is electrically connected with the gate line 11, and a first electrode and a second electrode of the threshold compensation transistor T3 are electrically connected with a second electrode and a gate electrode of the drive transistor T1, respectively.

As shown in FIG. 11, a gate electrode of the first light-emitting control transistor T4 is electrically connected with the light-emitting control signal line 15, a first electrode and a second electrode of the first light-emitting control transistor T4 are electrically connected with the first power line 13 and the first electrode of the drive transistor T1, respectively. A gate electrode of the second light-emitting control transistor T5 is electrically connected with the light-emitting control signal line 15, a first electrode and a second electrode of the second light-emitting control transistor T5 are electrically connected with the second electrode of the drive transistor T1 and a first electrode of the light-emitting element 20, respectively. A gate electrode of the first reset transistor T6 is electrically connected with the reset control signal line 17, and a first electrode and a second electrode of the first reset transistor T6 are electrically connected with the initialization signal line 16 and the gate electrode of the drive transistor T1, respectively. A gate electrode of the second reset transistor T7 is electrically connected with the reset control signal line 17, and a first electrode and a second electrode of the second reset transistor T7 are electrically connected with the initialization signal line 16 and the first electrode (which may be a pixel electrode, such as an anode, of the OLED) of the light-emitting element 20, respectively. A second electrode (which may be a common electrode, such as a cathode, of the OLED) of the light-emitting element 20 is electrically connected with the second power line 14.

It should be noted that, transistors used in the embodiment of the present disclosure may be thin film transistors, field effect transistors or other switching devices with the like characteristics. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present disclosure may be the source electrode, and the second electrode may be the drain electrode; alternatively, the first electrode of the transistor may be the drain electrode, and the second electrode may be the source electrode.

In addition, the transistors may be classified into N-type transistors and P-type transistors according to the characteristics of the transistors. The embodiments of the present disclosure illustrate the technical solution of the present disclosure in detail by taking the transistors as P-type transistors as an example. Based on the description and teaching of the implementations of the present disclosure, one of ordinary skill in the art can easily think of an implementation in which at least some of the transistors in the pixel circuit structure of the embodiment of the present disclosure adopt N-type transistors, that is, an implementation of using an N-type transistor or a combination of an N-type transistor and a P-type transistor, without any inventive work, therefore, these implementations are also within the scope of the present disclosure.

For example, the active layer of the transistor used in the embodiments of the present disclosure may be single crystal silicon, polycrystalline silicon (such as low temperature poly-silicon), or metal oxide semiconductor material (such as, IGZO, AZO, etc.). In an example, the transistors are all P-type LTPS (low temperature poly-silicon) thin film transistors. In another example, the threshold compensation transistor T3 and the first reset transistor T6 that are directly connected with the gate electrode of the drive transistor T1 may be metal oxide semiconductor thin film transistors, that is, the channel material of the transistor is a metal oxide semiconductor material (such as, IGZO, AZO, etc.), the metal oxide semiconductor thin film transistor has a low leakage current and can help to reduce the leakage current of the gate electrode of the drive transistor T1.

For example, the transistors used in the embodiments of the present disclosure may comprise various structures, such as a top-gate type, a bottom-gate type, or a double-gate structure. In an example, the threshold compensation transistor T3 and the first reset transistor T6 that are directly connected with the gate electrode of the drive transistor T1 are double-gate thin film transistors, so as to help to reduce the leakage current of the gate electrode of the drive transistor T1.

For example, as shown in FIG. 12, the display panel 100 provided by the embodiment of the present disclosure further comprises: a data driver 102, a scan driver 103, and a controller 104. The data driver 102 is configured to provide the data signal Data to the pixel unit 101 according to an instruction of the controller 104; the scan driver 103 is configured to provide the light-emitting control signal EM, the scan signal Scan, the reset control signal Reset, and the like to the pixel unit 101 according to instruction of the controller 104. For example, the scan driver 103 is a GOA (Gate on Array) structure mounted on the display panel, or a driver chip (IC) structure that is bonded to the display panel. For example, different drivers may be adopted to provide the light-emitting control signal EM and the scan signal Scan, respectively. For example, the display panel 100 further comprises a power source (not shown) to provide the above voltage signals, the power source may be a voltage power source or a current power source as needed, and the power source is configured to provide the first power voltage ELVDD, the second power voltage ELVSS, the initialization signal Vint, and the like to the pixel unit 101 through the first power line 13, the second power line 14, and the initialization signal line 16, respectively.

Figure 13:
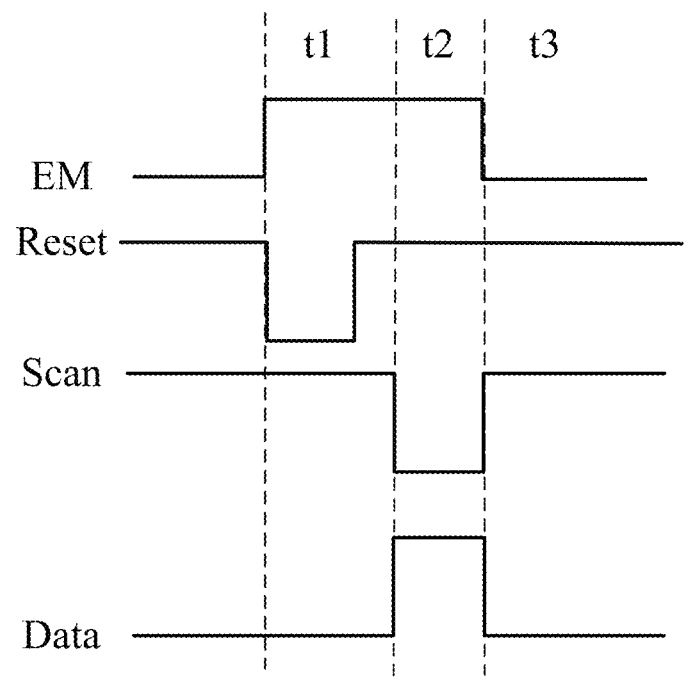
FIG. 13 is a timing signal diagram of a pixel unit in a display panel provided by an embodiment of the present disclosure.

FIG. 13 is a timing signal diagram of a pixel unit in a display panel provided by an embodiment of the present disclosure. A driving method of a pixel unit in the display panel provided by the embodiment of the present disclosure will be described below with reference to FIG. 13.

As shown in FIG. 13, in a display period of one frame, the driving method of the pixel unit comprises a reset phase t1, a data writing and threshold compensation phase t2, and a light-emitting phase t3.

In the reset phase t1, the light-emitting control signal EM is set to be a turn-off voltage, the reset control signal Reset is set to be a turn-on voltage, and the scan signal Scan is set to be a turn-off voltage.

In the data writing and threshold compensation phase t2, the light-emitting control signal EM is set to be a turn-off voltage, the reset control signal Reset is set to be a turn-off voltage, and the scan signal Scan is set to be a turn-on voltage.

In the light-emitting phase t3, the light-emitting control signal EM is set to be a turn-on voltage, the reset control signal Reset is set to be a turn-off voltage, and the scan signal Scan is set to be a turn-off voltage.

For example, the turn-on voltage in the embodiments of the present disclosure refers to a voltage that can make a first electrode and a second electrode of a corresponding transistor be turned on, and the turn-off voltage refers to a voltage that can make the first electrode and the second electrode of the corresponding transistor be turned off. In a case where the transistor is a P-type transistor, the turn-on voltage is a low voltage (for example, 0V), and the turn-off voltage is a high voltage (for example, 5V); in a case where the transistor is a N-type transistor, the turn-on voltage is a high voltage (for example, 5V), and the turn-off voltage is a low voltage (for example, 0V). The driving waveforms shown in FIG. 13 are all described by taking a P-type transistor as an example, that is, the turn-on voltage is a low voltage (for example, 0V), and the turn-off voltage is a high voltage (for example, 5V).

Please refer to FIG. 11 and FIG. 13 together, in the reset phase t1, the light-emitting control signal EM is a turn-off voltage, the reset control signal Reset is a turn-on voltage, and the scan signal Scan is a turn-off voltage. In this case, the first reset transistor T6 and the second reset transistor T7 are both in a turn-on state, and the data writing transistor T2, the threshold compensation transistor T3, the first light-emitting control transistor T4, and the second light-emitting control transistor T5 are all ill a turn-off state. An initialization signal (an initialization voltage) Vint is transmitted to the gate electrode of the drive transistor T1 by the first reset transistor T6 and then is stored by the storage capacitor Cst, so as to reset the drive transistor T1 and eliminate the data stored during emitting light in the last time (a previous frame), and the second reset transistor T7 transmits the initialization signal Vint to the first electrode of the light-emitting element 20 to reset the light-emitting element 20.

In the data writing and threshold compensation phase t2, the light-emitting control signal EM is a turn-off voltage, the reset control signal Reset is a turn-off voltage, and the scan signal Scan is a turn-on voltage. In this case, the data writing transistor T2 and the threshold compensation transistor T3 are in a turn-on state, and the first light-emitting control transistor T4, the second light-emitting control transistor T5, the first reset transistor T6 and the second reset transistor T7 are all in a turn-off state. At this time, the data writing transistor T2 transmits the data signal voltage Vdata to the first electrode of the drive transistor T1, that is, the data writing transistor T2 receives the scan signal Scan and the data signal Data and writes the data signal Data to the first electrode of the drive transistor T1 according to the scan signal Scan. The threshold compensation transistor T3 is turned on to connect the drive transistor T1 into a diode structure, therefore, the gate electrode of the drive transistor T1 can be charged. After the charging is completed, the gate voltage of the drive transistor T1 is Vdata+Vth, where Vdata is the data signal voltage, and Vth is a threshold voltage of the drive transistor T1, that is, the threshold compensation transistor T3 receives the scan signal Scan and performs threshold voltage compensation on the gate voltage of the drive transistor T1 according to the scan signal Scan. In this stage, a voltage difference between two ends of the storage capacitor Cst is ELVDD-Vdata-Vth.

In the light-emitting phase t3, the light-emitting control signal EM is a turn-on voltage, the reset control signal Reset is a turn-off voltage, and the scan signal Scan is a turn-off voltage. The first light-emitting control transistor T4 and the second light-emitting control transistor T5 are in a turn-on state, and the data writing transistor T2, the threshold compensation transistor T3, the first reset transistor T6, and the second reset transistor T7 are all in a turn-off state. The first power signal ELVDD is transmitted to the first electrode of the drive transistor T1 through the first light-emitting control transistor T4, the gate voltage of the drive transistor T1 is maintained at Vdata+Vth, a light-emitting current I flows into the light-emitting element 20 through the first light-emitting control transistor T4, the drive transistor T1, and the second light-emitting control transistor T5, and the light-emitting element 20 emits light. That is, the first light-emitting control transistor T4 and the second light-emitting control transistor T5 receive the light-emitting control signal EM, and control the light-emitting element 20 to emit light according to the light-emitting control signal EM. The light-emitting current I satisfies the following saturation current formula:

$$K(Vgs-Vth)^2 = K(Vdata+Vth-ELVDD-Vth)^2 = K(Vdata-ELVDD)^2$$

where, $$K = 0.5\ \mu_n Cox \frac{W}{L},$$

$\mu_n$ is a channel mobility of the drive transistor, Cox is a channel capacitance per unit area of the drive transistor T1, W and L are a channel width and a channel length of the drive transistor T1, respectively, and Vgs is a voltage difference between the gate electrode and the source electrode (that is, the first electrode of the drive transistor T1 in the embodiment) of the drive transistor T1.

It can be seen from the above equation that the current flowing through the light-emitting element 20 is independent of the threshold voltage of the drive transistor T1. Therefore, the pixel circuit structure is very well compensated for the threshold voltage of the drive transistor T1.

For example, in the pixel array of the display panel, in order to facilitate wiring, the reset control signal line 17 can be set as the scan line of the pixel units in the previous row, that is, the reset control signal line is the scan signal Scan(n-1) of the pixel units in the previous row, thereby reducing the number of wirings and signals.

For example, the ratio of the length of time of the light-emitting phase t3 to the display period of one frame can be adjusted. In this way, the luminescence brightness can be controlled by adjusting the ratio of the length of time of the light-emitting phase t3 to the display period of one frame. For example, the ratio of the length of time of the light-emitting phase t3 to the display period of one frame is adjusted by controlling the scan driver 103 in the display panel or an additionally provided driver.

For example, in other examples, the first stabilization capacitor C1 may also be disposed between the data line 12 and other signal line that provides a constant voltage signal. For example, the first stabilization capacitor C1 is disposed between the data line 12 and the second power line 14, or, the first stabilization capacitor C1 is disposed between the data line 12 and the initialization signal line 16. In other examples, the first light-emitting control transistor T4 or the second light-emitting control transistor T5 may not be provided, or the first reset transistor T6 or the second reset transistor T7 may not be provided, or the like, that is, the embodiment of the present disclosure is not limited to the specific pixel circuit shown in FIG. 11, other pixel circuit capable of achieving to compensate for the drive transistor can be adopted. Based on the description and teachings of the implementations of the present disclosure, other arrangements that can be easily conceived by those skilled in the art without any inventive work are within the scope of the present disclosure.

Figure 14:
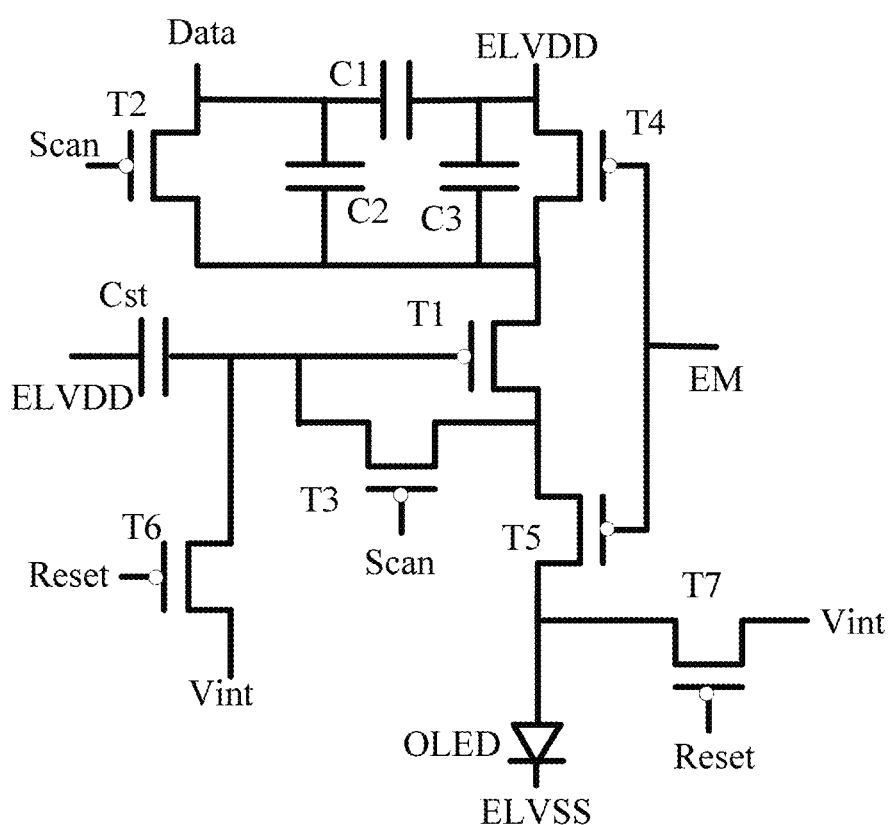
FIG. 14 is a schematic structural diagram of a display panel provided by another embodiment of the present disclosure.

FIG. 14 is a schematic diagram of a display panel provided by another embodiment of the present disclosure. As shown in FIG. 14, a difference between the display panel provided by this embodiment and the display panel in FIG. 11 is that the display panel 100 further comprises a second stabilization capacitor C2 and/or a third stabilization capacitor C3, the second stabilization capacitor C2 is disposed between the data line 12 and the first electrode of the drive transistor T1, and the third stabilization capacitor C3 is disposed between the first power line 13 and the first electrode of the drive transistor T1. Due to the presence of the second stabilization capacitor C2, the interference of the parasitic capacitance between the data line 12 and the gate electrode of the drive transistor T1 to the gate signal of the drive transistor T1 is further reduced. Due to the presence of the third stabilization capacitor C3, the interference of the parasitic capacitance between the first power line 13 and the gate electrode of the drive transistor T1 to the gate signal of the drive transistor T1 is reduced.

Figure 15:
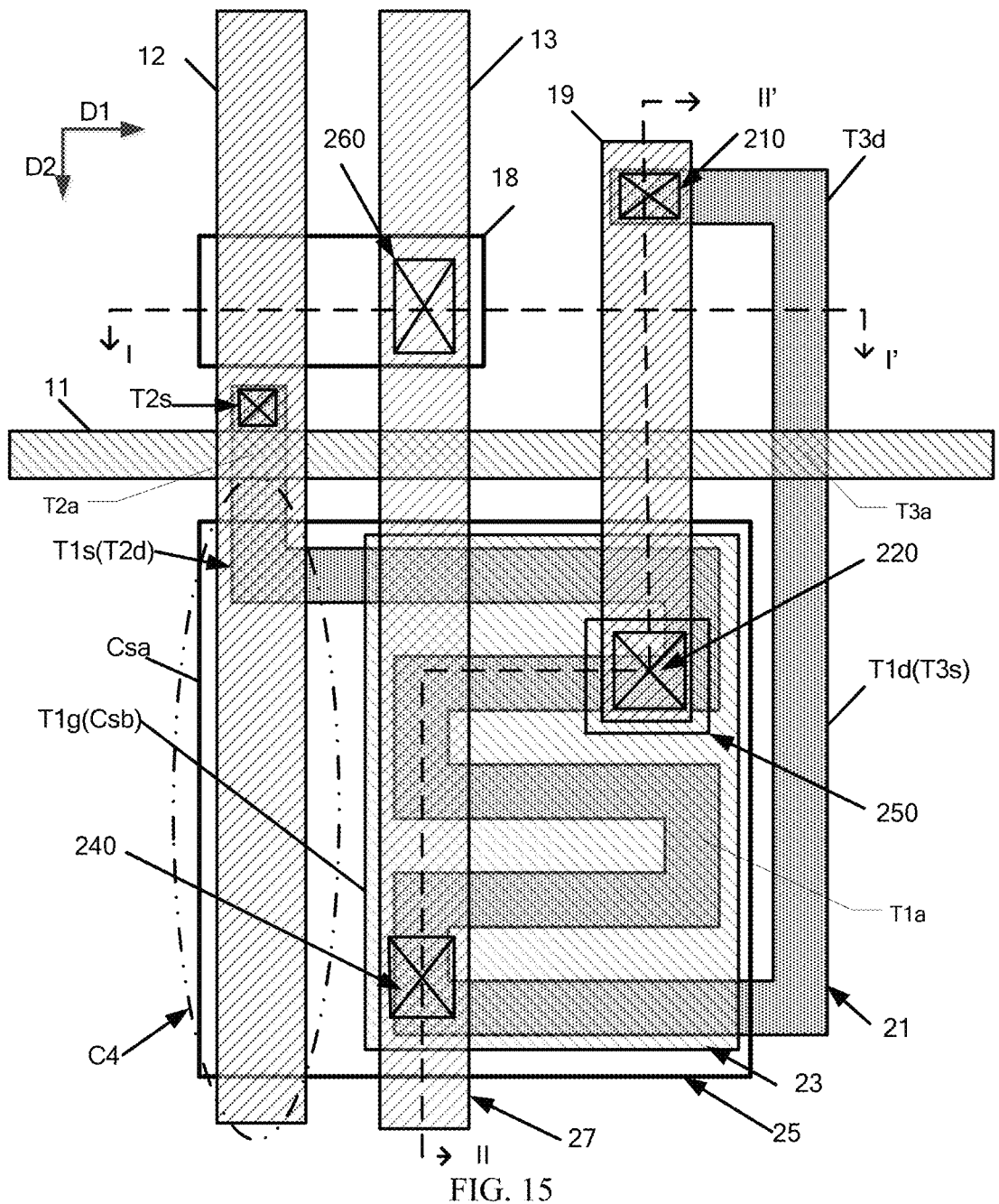
FIG. 15 is a schematic plane diagram of a display panel provided by an embodiment of the present disclosure.
Figure 16:
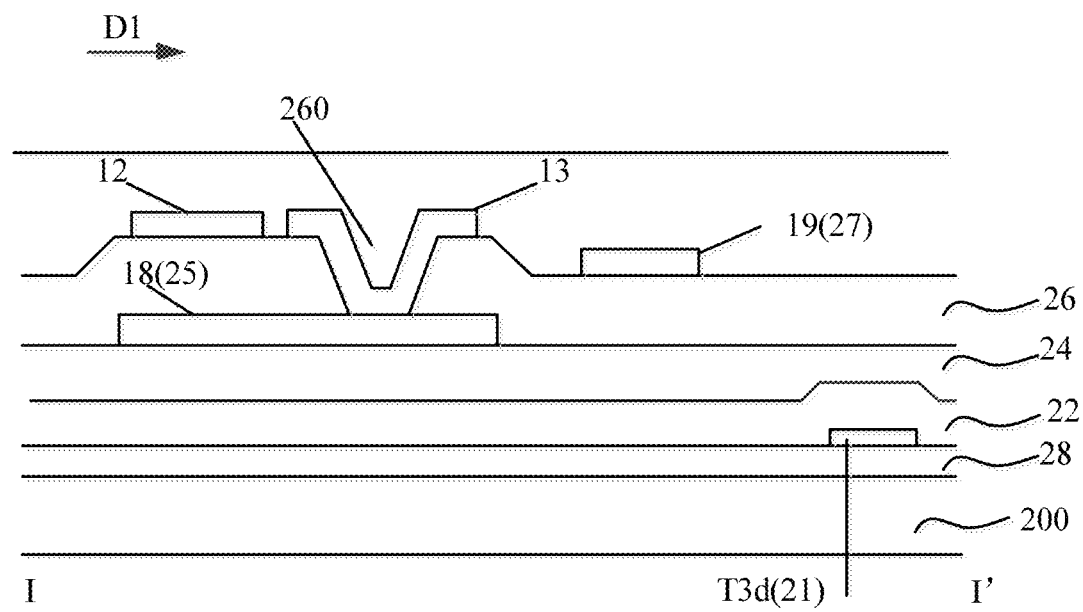
FIG. 16 is a cross-sectional view of the display panel in FIG. 15 taken along a line I-I'.
Figure 17:
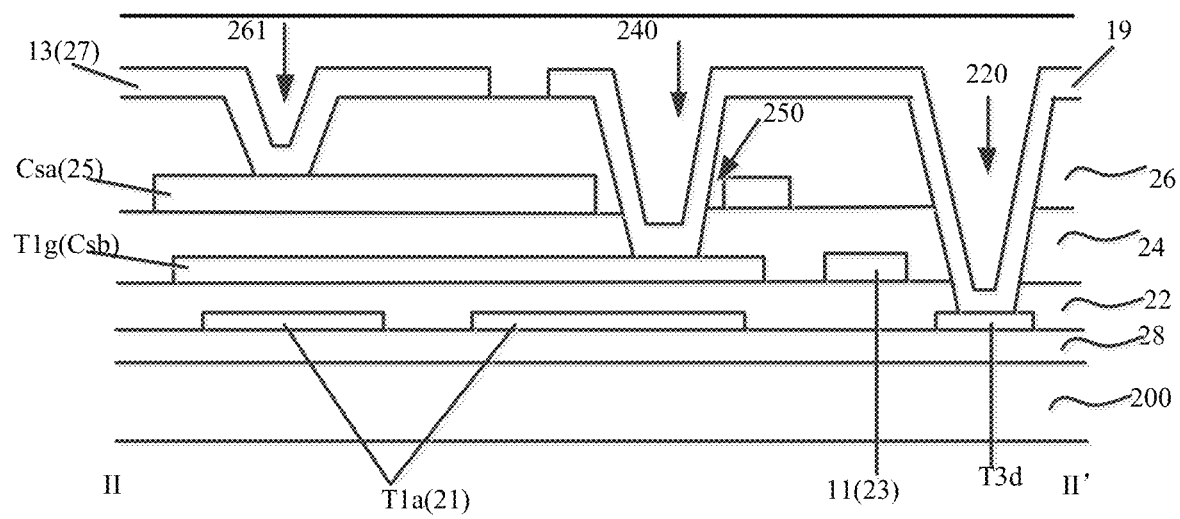
FIG. 17 is a cross-sectional view of the display panel in FIG. 15 taken along a line II-II'.

FIG. 15 is a schematic diagram (exemplary layout) of an exemplary plane structure of a display panel 100 shown in FIG. 11. For the sake of clarity, only the structures of the drive transistor T1, the data writing transistor T2, the threshold compensation transistor T3, the storage capacitor Cst, and the first stabilization capacitor C1 are shown in the figure, and the structures of other transistors are not shown. FIG. 16 is a cross-sectional view of the display panel in FIG. 15 taken along a line I-I', and FIG. 17 is a cross-sectional view of the display panel in FIG. 15 taken along a line II-II'. The display panel 100 provided by the embodiment of the present disclosure will be exemplarily described below with reference to FIGS. 15-17.

It should be understood herein that in the present disclosure, "same layer" refers to a layer structure formed by a film layer for forming a specific pattern by the same film forming process and then by one patterning process using the same mask. Depending on the different specific patterns, the same patterning process may comprise several exposure, development or etching processes, and the specific patterns in the formed layer structure may be continuous or discontinuous, and these specific patterns may also be at different heights or have different thicknesses. For example, in the embodiment of the present disclosure, a pattern of a plurality of components/elements can be disposed in the same layer, which cannot increase the number of the film layers, reduce the thickness of the display panel, and simplify the manufacturing process.

It should also be noted that the electrical connection between A and B referred to in the present disclosure comprises the case where A is a part of B and the case where B is a part of A.

For convenience of description, in the figures and the following description, T1g, T1s, T1d, T1a respectively indicate the gate electrode, the first electrode, the second electrode, and the channel region of the drive transistor T1.

T2g, T2s, T2d, T2a respectively indicate the gate electrode, the first electrode, the second electrode, and the channel region of the data writing transistor T2. T3g, T3s, T3d, T3a respectively indicate the gate electrode, the first electrode, the second electrode, and the channel region of the threshold compensation transistor T3, and Csa and Csb respectively denote the first electrode and the second electrode of the storage capacitor Cst.

As shown in the figures, the display pane 100 comprises a substrate 200 and a semiconductor pattern layer 21, a first insulation layer 22, a first conductive pattern layer 23, a second insulation layer 24, a second conductive pattern layer 25, an interlayer insulation layer 26, and a third conductive pattern layer 27 which are sequentially stacked on the substrate 200.

For example, the semiconductor pattern layer 21 comprises an active layer T1a of the drive transistor T1, an active layer T2a of the data writing transistor T2, and an active layer T3a of the threshold compensation transistor T3.

For example, the first conductive pattern layer 23 comprises a gate line 11, a second electrode Csb of the storage capacitor Cst, a gate electrode T1g of the drive transistor T1, a gate electrode T2g of the data writing transistor, and a gate electrode T3g of the threshold compensation transistor.

For example, the second conductive pattern layer 25 comprises a first electrode Cst of the storage capacitor Cst.

For example, the first electrode Csa of the storage capacitor Cst and the gate electrode T1g of the drive transistor T1 overlap each other in a direction perpendicular to the substrate 200.

For example, the third conductive pattern layer 27 comprises a data line 12 and a first power line 13.

As shown in FIG. 15, the gate line 11 extends in a first direction D1, and the data line 12 and the first power line 13 extend in a second direction D2 and are disposed in the same layer. For example, the first direction D1 and the second direction D2 are substantially perpendicular to each other.

In the present embodiment, the first stabilization capacitor C1 comprises a first capacitor electrode 18 that is separately provided and is electrically connected with the first power line 13, and a second capacitor electrode of the first stabilization capacitor C1 is served by a portion of the data line 12 itself. In other embodiments, the second capacitor electrode of the first stabilization capacitor C1 may also separately provided as an electrode connected with the data line 12.

For example, as shown in FIG. 15 and FIG. 16, the first capacitor electrode 18 is disposed on a side of the data line 12 close to the substrate 200, and is disposed in the same layer as the first electrode Csa of the storage capacitor Cst. The first capacitor electrode 18 is electrically connected with the first power line 13 through a first via hole 260 penetrating the interlayer insulation layer 60. The first capacitor electrode 18 and the data line 12 overlap each other in the direction perpendicular to the substrate 200, thereby forming the first stabilization capacitor C1.

For example, in the manufacturing process of the display panel 200, the semiconductor pattern layer 21 is subject to a treatment to turn it to be conductive by using a self-alignment process with the first conductive pattern layer 23 as a mask, for example, the semiconductor pattern layer 21 is heavily doped by ion implantation, so that a portion of the semiconductor pattern layer 21 not covered by the first conductive pattern layer 23 is made to be conductive, to form a source region (first electrode T1s) and a drain region (second electrode T1d) of the drive transistor T1, a source region (first electrode T2s) and a drain region (second electrode T2d) of the data writing transistor T2, and a source region (first electrode T3s) and a drain region (second electrode T3d) of the threshold compensation transistor T3. A portion of the semiconductor pattern layer 21 covered by the first conductive pattern layer 23 retains semiconductor characteristics, to form channel regions T1a, T2a and T3a of the respective transistors.

For example, as shown in FIG. 15 and FIG. 17, the display panel 200 further comprises a first connection electrode 19, and the first connection electrode 19 is configured to connect the drain region of the threshold compensation transistor T3 and the gate electrode T1g of the drive transistor T1, thereby electrically connecting the second electrode T3d of the threshold compensation transistor T3 and the gate electrode T1g of the drive transistor T1.

For example, the first connection electrode 19 is disposed in the same layer as the data line 12, and an extending direction of the first connection electrode 19 is the same as an extending direction of the data line 12.

Referring to FIG. 15 and FIG. 16, because the parasitic capacitance is between the data line 12 and the first connection electrode 19 or between the data line 12 and the second electrode T3d of the threshold compensation transistor T3, by disposing the first capacitor electrode 18 on a side of the data line 12 close to the substrate 200, the first capacitor electrode 18 can function to raise the data line, and can increase the distance between the data line 12 and the first connection electrode 19 and the distance between the data line 12 and the side of the second electrode T3d of the threshold compensation transistor T3, thereby reducing the parasitic capacitance. For example, because the second electrode T3d of the threshold compensation transistor T3 is directly connected with the gate electrode of the drive transistor T1, reducing the parasitic capacitance helps to reduce the interference of the data line to the gate signal of the drive transistor T1.

For example, an orthographic projection of the first connection electrode 19 on the layer where the first capacitor electrode 18 is located (i.e., the second conductive pattern layer 23) and the first capacitor electrode 18 overlaps each other in a direction (that is, the first direction D1) perpendicular to the direction in which the data line 12 extends.

For example, referring to FIG. 16, an orthographic projection of the first connection electrode 19 on the layer where the first capacitor electrode 18 is located (i.e., the second conductive pattern layer 23) and the first capacitor electrode 18 overlaps each other in a direction (that is, the first direction D1) perpendicular to the direction in which the data line 12 extends.

For example, an opening 250 is disposed in the first electrode Csa of the storage capacitor Cst, the first connection electrode 19 is electrically connected with the gate electrode of the drive transistor T1 (that is, the second electrode Csb of the storage capacitor Cst) through the opening 250 and a second via hole 240 penetrating the second insulation layer 24 and the interlayer insulation layer 26.

For example, the first connection electrode 19 is electrically connected with the second electrode T3d of the threshold compensation transistor T3 through a third via hole 220 penetrating through the first insulation layer 22, the second insulation layer 24, and the interlayer insulation layer 26.

For example, the first power line 13 is electrically connected with the first electrode Csa of the storage capacitor Cst through a fourth via hole 261 penetrating the interlayer insulation layer 26.

For example, referring to FIG. 15, the first electrode Csa of the storage capacitor Cst and the data line 13 overlap each other in a direction perpendicular to the substrate, thereby constituting a fourth stabilization capacitor C4. Because the first electrode Csa of the storage capacitor Cst is electrically connected with the first power line 13, the fourth stabilization capacitor C4 is also formed between the first power line and the data line, thus further reducing the interference of the parasitic capacitance between the data line 12 and the gate electrode of the drive transistor T1 on the gate signal of the drive transistor T1. For example, materials of the first insulation layer 22, the second insulation layer 24, and the interlayer insulation layer 26 may comprise inorganic insulation materials such as silicon nitride, silicon oxynitride, or the like, or aluminum oxide, titanium nitride, or the like. For example, the insulation materials may further comprise organic insulation materials such as acrylic acid, polymethyl methacrylate (PMMA), or the like. For example, the insulation layer may be a single layer structure or a multilayer structure.

For example, materials of the first conductive pattern layer 23, the second conductive pattern layer 25, the third conductive pattern layer 27, the fourth conductive pattern layer 29, the functional signal line, the first conductive structure, and the second conductive structure comprise gold (Au), silver (Ag), copper (Cu), aluminum (Al), molybdenum (Mo), magnesium (Mg), tungsten (W), and an alloy material obtained by combining the above metals; or a conductive metal oxide material such as indium tin oxide (ITO), indium zinc oxide (IZO), zinc oxide (ZnO), zinc oxide aluminum (AZO), and the like.

For example, the display panel 100 further comprise a buffer layer 28 disposed between the substrate 200 and the semiconductor pattern layer 21. For example, the substrate 200 is a glass substrate, and the buffer layer 28 is silicon dioxide and is used to prevent impurities (metal ions) in the substrate 200 from diffusing into the pixel circuit structure.

In the embodiment of the present disclosure, the functional signal line may comprise at least one of the initialization signal line 16, the light-emitting control signal line 15, the reset control signal line 17, the first power line 13, and the second power line 14.

For example, in an embodiment, the array substrate sequentially comprises: a substrate, a polysilicon layer, a first gate insulation layer, a first conductive pattern layer (comprising a gate line, gate electrodes, a second electrode of a storage capacitor), a second gate insulation layer, a second conductive pattern layer (comprising an initialization signal line, a first electrode of the storage capacitor, a first connection electrode), an interlayer insulation layer, a third conductive pattern layer (comprising a data line, a first power line of the display area), a passivation layer, a planarization layer, a fourth conductive pattern layer (comprising a first electrode, a first conductive structure, the first electrode may be an anode of the OLED), a light emitting layer, a second electrode (which may be a cathode of the OLED). The functional signal line is the first power line, and the first conductive structure and the first electrode are disposed in the same layer, and the first conductive structure is connected in parallel with the first power line.

In the embodiments of the present disclosure, the first conductive structure 02 may also be disposed separately. For example, the array substrate comprises a substrate, a polysilicon layer, a first gate insulation layer, a first conductive pattern layer (comprising a gate line, gate electrodes, a second electrode of a storage capacitor), a second gate insulation layer, a second conductive pattern layer (comprising an initialization signal line, a first electrode of the storage capacitor, a first connection electrode), an interlayer insulation layer, a third conductive pattern layer (comprising a data line, a first power line of the display area), an organic insulation layer, a passivation layer, a fourth conductive pattern layer (comprising a first conductive structure), a second planarization layer, an anode layer of the OLED, a light emitting layer, a cathode layer of the OLED. The organic insulation layer and the passivation layer are interposed between the fourth conductive pattern layer and the third conductive pattern layer, and the passivation layer is directly under the fourth conductive pattern layer, which can ensure that the layer where the first conductive structure is located is completely etched, and the organic insulation layer can provide as much planarization as possible. In the embodiment, the functional signal line is the first power line, and the first conductive structure is connected in parallel with the first power line.

The pixel circuit structure in the display panel provided by the embodiment of the present disclosure is not limited to the case shown in FIG. 11, and a pixel circuit structure of other structures may also be used. For example, at least one of the first stabilization capacitor C1, the first light-emitting control transistor T4, the second light-emitting control transistor T5, the first reset transistor T6, and the second reset transistor T6 may be not provided.

For example, the display panel provided by the embodiment of the present disclosure can be applied to any product or component having a display function, such as a mobile phone, a tablet computer, a television, a display, a notebook computer, a digital photo frame, a navigator, and the like. For example, the display panel is an organic light-emitting diode display panel.

An embodiment of the present disclosure further provides a display device, comprising the above display panel. For example, the display device may be an electronic device, such as a mobile phone, a tablet computer, a television, a display, a notebook computer, a digital photo frame, a navigator, and the like, to which the display panel is applied. For example, the display device is an organic light-emitting diode display device.

What are described above is related to the specific embodiments of the present disclosure only and not limitative to the scope of the disclosure, within the disclosed technical scope of the disclosure, the modification and replacement, which any skilled who is familiar with the technical field may easily conceive, should be covered within the scope of the protection of the disclosure. Therefore, the protection scope of the present disclosure should be based on the protection scope of the claims.

What is claimed is:

1. A display panel, comprising:
   a substrate, comprising a display area and a peripheral area on at least one side of the display area;
   a plurality of pixel units, in the display area, each pixel unit comprising a light-emitting unit and a pixel circuit structure for providing a driving current to the light-emitting unit, and the light-emitting unit being an electroluminescent element;
   a functional signal line, connected with the pixel circuit structure of each pixel unit and providing a common voltage signal for the pixel circuit structure; and
   a first conductive structure, connected in parallel with the functional signal line and located at a layer different from that of the functional signal line, the plurality of pixel units extend along a row direction and a column direction to form a plurality of rows of pixel units and a plurality of columns of pixel units, the functional signal line comprises a first signal line extending along a first direction, and the first signal line extends along a row of pixel units or a column of pixel units, the functional signal line comprises a second signal line extending along a second direction, the second signal line is in the peripheral area, the second signal line is connected with the first signal line, and the second direction intersects the first direction, the first conductive structure comprises a first conductive line extending along the first direction, and the first conductive line extends along a row of pixel units or a column of pixel units, the first conductive structure comprises a second conductive line extending along the second direction, the second conductive line is in the peripheral area, and the second conductive line is connected with the first conductive line, the display panel further comprises an insulation layer between the first conductive structure and the functional signal line, wherein the first conductive structure and the functional signal line are connected by a via hole penetrating the insulation layer located between the first conductive structure and the functional signal line.

2. The display panel according to claim 1, wherein the second signal line is connected with a signal input circuit.

3. The display panel according to claim 1, wherein the via hole comprises at least one of a display area via hole in the display area and a peripheral area via hole in the peripheral area.

4. The display panel according to claim 3, wherein in a direction perpendicular to the substrate, the first signal line and the first conductive line have a first overlapping area, the display area via hole is in the first overlapping area, and the first signal line and the first conductive line are connected through the display area via hole.

5. The display panel according to claim 3, wherein in a direction perpendicular to the substrate, the second signal line and the second conductive line have a second overlapping area, the peripheral area via hole is in the second overlapping area, and the second signal line and the second conductive line are connected through the peripheral area via hole.

6. The display panel according to claim 3, wherein a plurality of display area via holes are provided, and at least one display area via hole is provided for each pixel unit, and a plurality of peripheral area via holes are provided, and each of the plurality of peripheral area via holes corresponds to a row of pixel units or a column of pixel units.

7. The display panel according to claim 1, wherein the first conductive line is connected with the first signal line through a transfer pattern, the first conductive line and the transfer pattern are connected by a via hole penetrating through an insulation layer located between the first conductive line and the transfer pattern, and the transfer pattern and the first signal line are connected by a via hole penetrating through an insulation layer located between the transfer pattern and the first signal line.

8. The display panel according to claim 1, wherein each light-emitting unit comprises a first electrode, first electrodes of different light-emitting units are insulated from each other, the first conductive structure is in a same layer as the first electrode, and the first conductive line extends in a gap between first electrodes of adjacent rows of pixel units or in a gap between first electrodes of adjacent columns of pixel units.

9. The display panel according to claim 1, further comprising a gate line, a data line, a first power line and a second power line, wherein the pixel circuit structure comprises a storage capacitor, a drive transistor, a data writing transistor, and a threshold compensation transistor, a first electrode of the storage capacitor is electrically connected with the first power line, and a second electrode of the storage capacitor is electrically connected with a second electrode of the threshold compensation transistor through a first connection electrode;

a gate electrode of the data writing transistor is electrically connected with the gate line, and a first electrode and a second electrode of the data writing transistor are electrically connected with the data line and a first electrode of the drive transistor, respectively;

a gate electrode of the threshold compensation transistor is electrically connected with the gate line, and a first electrode and a second electrode of the threshold compensation transistor are electrically connected with a second electrode and a gate electrode of the drive transistor, respectively; and a second electrode of the light-emitting unit is electrically connected with the second power line.

10. The display panel according to claim 9, wherein the first conductive line comprises a first portion having a first width and a second portion having a second width, the first width is smaller than the second width, and in a direction perpendicular to the substrate, the second portion overlaps at least one of a channel region of the drive transistor, a channel region of the data writing transistor, and a channel region of the threshold compensation transistor.

11. The display panel according to claim 9, further comprising an initialization signal line, a light-emitting control signal line and a reset control signal line, wherein the pixel circuit structure further comprises a first light-emitting control transistor, a second light-emitting control transistor, a first reset transistor, and a second reset transistor;

a gate electrode of the first light-emitting control transistor is electrically connected with the light-emitting control signal line, a first electrode and a second electrode of the first light-emitting control transistor are electrically connected with the first power line and the first electrode of the drive transistor, respectively;

a gate electrode of the second light-emitting control transistor is electrically connected with the light-emitting control signal line, a first electrode and a second electrode of the second light-emitting control transistor are electrically connected with the second electrode of the drive transistor and a first electrode of the light-emitting unit, respectively;

a gate electrode of the first reset transistor is electrically connected with the reset control signal line, and a first electrode and a second electrode of the first reset transistor are electrically connected with the initialization signal line and the gate electrode of the drive transistor, respectively; and a gate electrode of the second reset transistor is electrically connected with the reset control signal line, and a first electrode and a second electrode of the second reset transistor are electrically connected with the initialization signal line and the first electrode of the light-emitting unit, respectively.

12. The display panel according to claim 11, wherein the functional signal line comprises at least one of the initialization signal line, the first power line, and the second power line.

13. The display panel according to claim 11, wherein
the gate line, the light-emitting control signal line and the reset control signal line are in a first conductive pattern layer;
the first signal line is in a second conductive pattern layer;
the data line, the first power line, and the second signal line are in a third conductive pattern layer;
the first electrode, the first conductive line and the second conductive line are in a fourth conductive pattern layer; and
the first signal line and the second signal line constitute the initialization signal line, and the first conductive line and the second conductive line constitute the first conductive structure.

14. The display panel according to claim 13, further comprising a second conductive structure, wherein the functional signal line is the initialization signal line, and the second conductive structure is connected in parallel with the first power line, and the second conductive structure is between the third conductive pattern layer and the fourth conductive pattern layer.

15. A display device, comprising the display panel according to claim 1.

* * * * *